US 9,241,429 B2

(12) United States Patent
Kaneko et al.

(10) Patent No.: US 9,241,429 B2
(45) Date of Patent: Jan. 19, 2016

(54) POWER MODULE AND POWER CONVERSION APPARATUS USING SAME

(75) Inventors: Yujiro Kaneko, Hitachinaka (JP); Tokihito Suwa, Hitachinaka (JP); Shinji Hiramitsu, Tokyo (JP); Takahiro Shimura, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 214 days.

(21) Appl. No.: 14/124,172

(22) PCT Filed: May 22, 2012

(86) PCT No.: PCT/JP2012/063065
§ 371 (c)(1),
(2), (4) Date: Dec. 5, 2013

(87) PCT Pub. No.: WO2012/169342
PCT Pub. Date: Dec. 13, 2012

(65) Prior Publication Data
US 2014/0098588 A1    Apr. 10, 2014

(30) Foreign Application Priority Data
Jun. 8, 2011 (JP) .................. 2011-128304

(51) Int. Cl.
*H05K 7/20* (2006.01)
*H02M 7/00* (2006.01)
(Continued)

(52) U.S. Cl.
CPC ............. *H05K 7/209* (2013.01); *B60L 11/14* (2013.01); *H02M 7/003* (2013.01);
(Continued)

(58) Field of Classification Search
CPC ..... H05K 7/20; H05K 7/209; H05K 7/20909; H05K 7/20927; G06F 1/20; H01L 23/10; H01L 23/34; H01L 23/427; H01L 23/473; H01L 23/492; H02M 7/00; H02M 7/003; F28F 7/00

USPC ............. 361/679.46–679.54, 688, 689, 698, 361/699–702, 704–715, 721–727, 55, 56, 361/115, 156; 363/16, 37, 55, 71, 95–98, 363/120, 131, 132, 141, 144–147; 257/686, 257/690–692, 678, 698, 706–727; 165/80.2, 80.3, 80.4, 80.5, 104.19, 165/104.33, 185; 174/15.1, 15.2, 16.3; 438/106, 108, 118–122; 29/592.1, 740, 29/741, 759, 602.1, 831, 832
See application file for complete search history.

(56) References Cited

U.S. PATENT DOCUMENTS 7,504,720 B2 * 3/2009 Nakatsu et al. ....... H01L 25/071
257/712
7,812,443 B2 * 10/2010 Tokuyama et al. ... H01L 23/473
257/706
(Continued)

FOREIGN PATENT DOCUMENTS

JP    02005175163 A  *  6/2005  ............. H01L 23/40
JP    2008-259267 A     10/2008
(Continued)

OTHER PUBLICATIONS
International Search Report (PCT/ISA/210) with English translation dated Aug. 28, 2012 (Three (3) pages).

*Primary Examiner* — Michail V Datskovskiy
(74) *Attorney, Agent, or Firm* — Crowell & Moring LLP

(57) ABSTRACT

A power module includes a plurality of semiconductor devices constituting upper/lower arms of an inverter circuit, a plurality of conductive plates arranged to face electrode surfaces of the semiconductor devices and a module case configured to accommodate the semiconductor devices and conductive plates, wherein the module case includes a heat-radiation member made of plate-like metal and facing a surface of the conductive plate and a metallic frame body having an opening that is closed by the heat-radiation member, and wherein a heat-radiation fin unit having a plurality of heat-radiation fins vertically arranged thereon is provided at a center of the heat-radiation member, and a joint portion with the frame body is provided at an peripheral edge of the heat-radiation member, and the heat radiation member has a heat conductivity higher than that of the frame body, and the frame body has a higher rigidity than that of the heat-radiation member.

8 Claims, 16 Drawing Sheets

(51) Int. Cl.
   *B60L 11/14* (2006.01)
   *H01L 23/34* (2006.01)
(52) U.S. Cl.
   CPC ........ *H05K 7/20909* (2013.01); *B60L 2200/26* (2013.01); *B60L 2210/40* (2013.01); *Y02T 10/70* (2013.01); *Y02T 10/7077* (2013.01); *Y02T 10/7241* (2013.01)

(56) References Cited

U.S. PATENT DOCUMENTS

| | | | | |
|---|---|---|---|---|
| 7,848,104 | B2 * | 12/2010 | Shinohara | H01L 23/3107 165/80.3 |
| 7,968,925 | B2 * | 6/2011 | Tokuyama et al. | H01L 23/473 257/299 |
| 7,978,471 | B2 * | 7/2011 | Tokuyama et al. | H01L 23/36 165/104.33 |
| 8,064,234 | B2 * | 11/2011 | Tokuyama et al. | H01L 23/473 363/132 |
| 8,279,605 | B2 * | 10/2012 | Kawanami et al. | H01L 23/642 361/704 |
| 2009/0194862 | A1 * | 8/2009 | Kitami | H01L 23/3185 257/690 |
| 2011/0299265 | A1 | 12/2011 | Nakatsu et al. | |
| 2013/0062751 | A1 | 3/2013 | Takagi et al. | |

FOREIGN PATENT DOCUMENTS

| | | | |
|---|---|---|---|
| JP | 02010110143 A * | 5/2010 | H02M 7/48 |
| JP | 2011-233606 A | 11/2011 | |
| JP | 2012-5322 A | 1/2012 | |
| JP | 2012-15224 A | 1/2012 | |
| JP | 2012-178484 A | 9/2012 | |
| JP | 2013-39615 A | 2/2013 | |
| JP | 2013-73964 A | 4/2013 | |
| WO | WO 2010/050594 A1 | 5/2010 | |
| WO | WO 2011/136222 A1 | 11/2011 | |

* cited by examiner

POWER MODULE AND POWER CONVERSION APPARATUS USING SAME

TECHNICAL FIELD

The present invention relates to a power module and a power conversion apparatus using the same, which has power semiconductor devices for performing switching operation for converting a direct current electric power into an alternate current electric power or converting an alternate current electric power into a direct current electric power.

BACKGROUND ART

In recent years, it is desired to widely popularize hybrid vehicles and electric automobiles in a short time in order to reduce the environmental load. In hybrid vehicles and electric automobiles, reduction of the sizes of mounted components and reduction of the cost are regarded as important, and a power conversion apparatus is not the exception and the size and the cost of the power conversion apparatus are desired to be reduced. As a result, since the density of heat generation becomes high, it is necessary to improve the cooling performance.

Among electronic components constituting the power conversion apparatus, the highest amount of heat generation is made by a power module. A known example of method for cooling the power module is a both-sides direct cooling method for inserting a power module into a cooling channel and cooling the power module by way of radiation fins provided at both sides (see PTL 1).

The power module described in PTL 1 is made by sandwiching a semiconductor chip with conductive plates and performing vacuum thermocompression bonding upon interposing insulating sheets between the conductive plates and first and second heat sinks, and adhering a bottom case, a top case, and a side case to the integrally structured heat sinks with an adhesive.

CITATION LIST

Patent Literature

PTL 1: JP 2008-259267 A

SUMMARY OF INVENTION

Technical Problem

However, the power module described in PTL 1 has such structure that the bottom case, the top case, and the side case are adhered with the adhesive, and therefore there is a problem in the rigidity, and there is concern about durability such as deformation when the power module is mechanically fixed to the housing of the power conversion apparatus, and deformation by creep, fatigue fracture, and the like.

Solution to Problem

According to a first aspect of the present invention, there is provided a power module including: a plurality of semiconductor devices constituting upper/lower arms of an inverter circuit; a plurality of conductive plates arranged to face electrode surfaces of the semiconductor devices; and a module case configured to accommodate the semiconductor devices and the conductive plates, wherein the module case includes, a heat radiation member made of plate-like metal and facing a surface of the conductive plate, and a metallic frame body having an opening portion that is closed by the heat radiation member, wherein a heat radiation fin unit having a plurality of heat radiation fins vertically arranged thereon is provided at a center of the heat radiation member, and a joint portion with the frame body is provided at an external peripheral edge of the heat radiation member, and the heat radiation member has a heat conductivity higher than that of the frame body, and the frame body is of a higher rigidity than that of the heat radiation member.

According to a second aspect of the present invention, in the power module according to the first aspect, it is preferable that the heat radiation member is a first heat sink and a second heat sink arranged to face each other.

According to a third aspect of the present invention, in the power module according to the second aspect, it is preferable that the first heat sink and the second heat sink have a fin peripheral edge unit provided to enclose the heat radiation fin unit between the joint portion and the heat radiation fin unit of them each, and when pressure is applied to the first heat sink and the second heat sink from an external side toward inside of the module case, bending rigidity of the peripheral edge unit of the first heat sink is configured to be less than bending rigidity of the peripheral edge unit of the second heat sink, so that the peripheral edge unit of the first heat sink is preferentially deformed.

According to a fourth aspect of the present invention, in the power module according to the third aspect, it is preferable that a thickness of the fin peripheral edge unit of the first heat sink is thinner than a thickness of the fin peripheral edge unit of the second heat sink.

According to a fifth aspect of the present invention, in the power module according to any of the second to fourth aspects, it is preferable that the plurality of conductive plates include a first conductive plate connected via a metal bonding material with an electrode surface of the semiconductor device, a second conductive plate connected via the metal bonding material with the other electrode surface of the semiconductor device, a module primary encapsulant body made by sealing the semiconductor device, the first conductive plate, and the second conductive plate with an encapsulant and the module case are crimped with an insulating member, and a portion of the first and second conductive plates is exposed from the encapsulant so as to be in contact with the insulating member.

According to a sixth aspect of the present invention, in the power module according to any of the second to fifth aspects, it is preferable that the frame body and the first heat sink, and the frame body and the second heat sink are joined by fused junction or solid-state welding.

According to a seventh aspect of the present invention, there is provided a power conversion apparatus configured to convert electric power from a direct current to an alternate current or from an alternate current to a direct current, using switching operation of a semiconductor device, the power conversion apparatus including: the power module according to any of the second to sixth aspects; and a channel forming body configured to from a cooling channel in which coolant flows, wherein the power module has first and second heat sinks arranged in the cooling channel and performs heat exchange with a coolant flowing in the cooling channel, so that heat from the semiconductor device is radiated to the coolant.

According to an eighth aspect of the present invention, in the power conversion apparatus according to the seventh aspect, it is preferable that the channel forming body is formed with an opening portion in communication with the cooling channel, the power module includes a cylindrical unit in a cylindrical shape having a bottom; and a flange portion formed in an opening of the cylindrical unit and fixed to the channel forming body to close the opening portion of the channel forming body, wherein the cylindrical unit is formed by joining the first heat sink and the second heat sink to the frame body, and a heat radiation fin provided on each of the first heat sink and the second heat sink is vertically arranged to protrude in the cooling channel.

Advantageous Effects of Invention

According to the present invention, a power module achieving not only a high degree of rigidity but also a high degree of heat radiation performance and a power conversion apparatus using the same can be provided.

DESCRIPTION OF EMBODIMENTS

Figure 1:
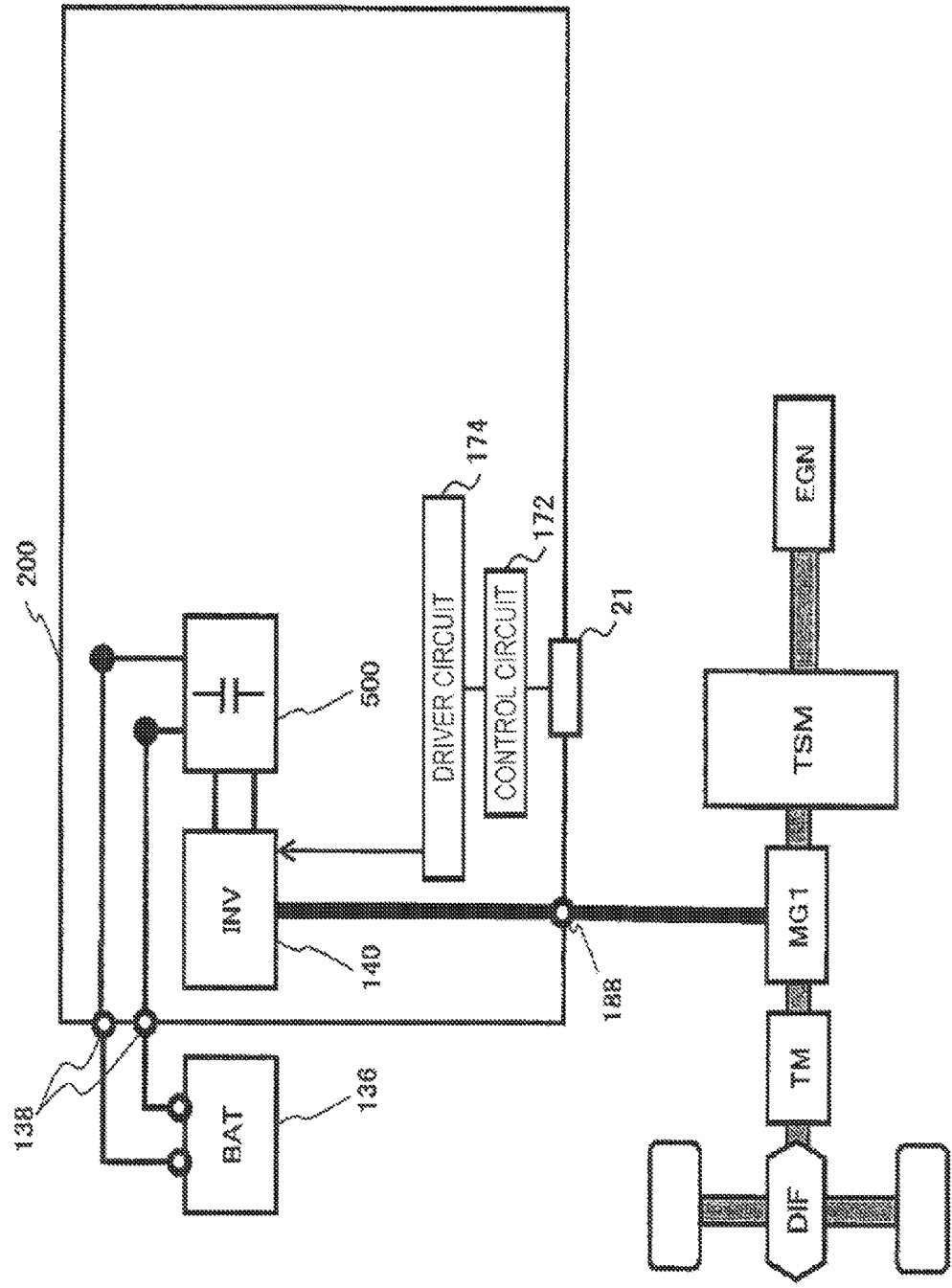
FIG. 1 is a figure illustrating a control block of a hybrid vehicle.

Hereinafter, an embodiment for carrying out the present invention will be explained with reference to drawings. FIG. 1 is a figure illustrating a control block of a hybrid vehicle. An engine EGN and a motor generator MG1 generate driving torque for a vehicle. The motor generator MG1 has not only a function of generating the rotation torque but also converting the mechanical energy applied from the outside to the motor generator MG1 into an electric power.

The motor generator MG1 is, for example, a synchronous machine or an induction machine, and as described above, operates not only as a motor but also as a generator in accordance with operation method. When the motor generator MG1 is mounted on an automobile, the motor generator MG1 is preferably small and outputs high level of output power, and a permanent magnet synchronous electric motor using a magnet such as neodymium is suitable for the motor generator MG1. In addition, the permanent magnet synchronous electric motor generates less heat in the rotor as opposed to an inductive electric motor, and therefore, from this point of view, the permanent magnet synchronous electric motor is also advantageous as an automobile motor.

The output torque of the engine EGN is transmitted to the motor generator MG1 via a torque distribution mechanism TSM. The rotation torque from the torque distribution mechanism TSM or the rotation torque generated by the motor generator MG1 is transmitted to wheels via a transmission TM and a differential gear DIF. On the other hand, during driving with regenerative braking, the rotation torque from the wheels is transmitted to the motor generator MG1, and on the basis of the provided rotation torque, an alternate current electric power is generated. As explained later, the generated alternate current electric power is converted by a power conversion apparatus 200 into a direct current electric power, which charges a high voltage battery 136, and the charged electric power is used again for driving energy.

Subsequently, the power conversion apparatus 200 will be explained, which converts the electric power from a direct current to an alternate current or from an alternate current to a direct current by switching operation of the semiconductor device. The inverter circuit 140 is electrically connected with the battery 136 via a direct current connector 138, and the electric power is exchanged between the battery 136 and the inverter circuit 140. When the motor generator MG1 is operated as a motor, the inverter circuit 140 generates alternate current electric power on the basis of the direct current electric power provided via the direct current connector 138 from the battery 136, and is provided via the alternate current terminal 188 to the motor generator MG1. The configuration including the motor generator MG1 and the inverter circuit 140 operates as electric power generation unit.

It should be noted that, in the present embodiment, the electric power generation unit is activated as an electric motor unit with the electric power of the battery 136, so that the vehicle can be driven with only the power of the motor generator MG1. Further, in the present embodiment, the electric power generation unit is activated as a power generation unit with the motive power of the engine EGN or the motive power provided by the wheels, so that the battery 136 can be charged.

The power conversion apparatus 200 includes a capacitor module 500 for smoothing the direct current electric power provided to the inverter circuit 140.

The power conversion apparatus 200 includes a communication connector for receiving commands from a host control apparatus or transmitting data representing the state to the host control apparatus. The power conversion apparatus 200 causes a control circuit 172 to calculate the amount of control of the motor generator MG1 on the basis of a command given by the connector, further perform calculation to determine whether to operate as a motor or as an electric power generator, and generates a control pulse based on a calculation result, and provides the control pulse to the driver circuit 174. The driver circuit 174 generates a driving pulse for controlling the inverter circuit 140 on the basis of the provided control pulse.

Subsequently, the configuration of the electric circuit of the inverter circuit 140 will be explained with reference to FIG. 2. It should be noted that, in the present embodiment, an insulated gate bipolar transistor is used as a semiconductor device, and this will be hereinafter abbreviated as IGBT.

A series circuit 150 of upper/lower arms is constituted by an IGBT 328 and a diode 156 of an upper arm and an IGBT 330 and a diode 166 of a lower arm. The inverter circuit 140 includes the series circuits 150 in association with three phases, i.e., U-phase, V-phase, and W-phase of the alternate current electric power which is to be output.

In this embodiment, these three phases correspond to the phases winding wires of the three phases of armature winding wire of the motor generator MG1. The series circuit 150 of the upper/lower arms of each of the three phases outputs an alternate current electric current from an intermediate electrode 169 which is a middle portion of the series circuit. The intermediate electrode 169 is connected to an alternate current bus bar 802 which is an alternate current electric power line to a motor generator MG1 via an alternate current terminal 159 and an alternate current terminal 188.

The collector electrode 153 of the IGBT 328 of the upper arm is electrically connected via the positive terminal 157 to a capacitor terminal 506 at a positive side of the capacitor module 500. The emitter electrode of the IGBT 330 of the lower arm is electrically connected via a negative terminal 158 to a capacitor terminal 504 at a negative side of the capacitor module 500.

As described above, the control circuit 172 receives a control command from a host control apparatus via the connector 21, and on the basis of this, the control circuit 172 generates a control pulse which is a control signal for controlling the IGBT 328 and the IGBT 330 constituting the upper arm or the lower arm of the series circuit 150 of each phase constituting the inverter circuit 140, and the control pulse is provided to the driver circuit 174.

On the basis of the control pulse, the driver circuit 174 provides the driving pulse for controlling the IGBT 328 and the IGBT 330 constituting the upper arm or the lower arm of the series circuit 150 of each phase to the IGBT 328 and the IGBT 330 of each phase. The IGBT 328 and the IGBT 330 perform conduction or cutting off operation on the basis of the driving pulse provided from the driver circuit 174, convert the direct current electric power provided by the battery 136 to three-phase alternate current electric power, and this converted electric power is provided to the motor generator MG1.

The IGBT 328 of the upper arm includes a collector electrode 153, an emitter electrode 155 for a signal, and a gate electrode 154. The IGBT 330 of the lower arm includes a collector electrode 163, an emitter electrode 165 for a signal, and a gate electrode 164. The diode 156 of the upper arm is electrically connected between the collector electrode 153 and the emitter electrode 155. The diode 166 is electrically connected between the collector electrode 163 and the emitter electrode 165.

It should be noted that switching power semiconductor device may be Metal Oxide Semiconductor-type Field Effect Transistor (hereinafter abbreviated as MOSFET), and in this case, the diode 156 and the diode 166 are unnecessary. When the direct current voltage is relatively high, the switching power semiconductor device is preferably be an IGBT, and when the direct current voltage is relatively low, the switching power semiconductor device is preferably be a MOSFET.

The capacitor module 500 includes a capacitor terminal 506 at the positive side, a capacitor terminal 504 at the negative side, a power supply terminal 509 at the positive side, and the power supply terminal 508 at the negative side. The direct current electric power of the high voltage from the battery 136 is provided via the direct current connector 138 to the power supply terminal 509 at the positive side and the power supply terminal 508 at the negative side, and the direct current electric power is provided to the inverter circuit 140 from the capacitor terminal 506 at the positive side and the capacitor terminal 504 at the negative side of the capacitor module 500.

On the other hand, the direct current electric power converted from the alternate current electric power by the inverter circuit 140 is provided to the capacitor module 500 from the capacitor terminal 506 at the positive side and the capacitor terminal 504 at the negative side, and the direct current electric power is provided from power supply terminal 509 at the positive side and the power supply terminal 508 at the negative side via the direct current connector 138 to the battery 136, and is accumulated in the battery 136.

The control circuit 172 includes a microcomputer for performing calculation processing of switching timing of the IGBT 328 and the IGBT 330. Input information into the microcomputer includes a target torque value required for the motor generator MG1, an electric current value provided from the series circuit 150 to the motor generator MG1, and a magnetic pole position of the rotor of the motor generator MG1.

The target torque value is based on the command signal which is output from the host control apparatus, not shown. The electric current value is detected on the basis of a detection signal provided by the electric current sensor 180. The magnetic pole position is detected on the basis of the detection signal which is output from a rotation magnetic pole sensor (not shown) such as a resolver provided in the motor generator MG1. In the present embodiment, for example, the electric current sensor 180 detects the 3-phase electric current values. Alternatively, the electric current sensor 180 detects may detect two-phase electric current values, or may obtain the 3-phase electric currents by calculation.

The microcomputer in the control circuit 172 calculates electric current command values of d axis, q axis of the motor generator MG1 on the basis of the target torque value, and calculates the voltage command value of d axis, q axis on the basis of difference between the electric current command values of d axis, q axis thus calculated and the electric current value of d axis, q axis thus detected, and converts the voltage command values of d axis, q axis thus calculated into voltage command values of U-phase, V-phase, W-phase on the basis of the detected magnetic pole position. Then, the microcomputer generates a pulse-like modulated wave on the basis of comparison between a fundamental wave (sine wave) and a carrier wave (triangular wave) based on U-phase, V-phase, W-phase voltage command values, and outputs the modulated wave thus generated to a driver circuit 174 as a PWM (pulse width modulation) signal.

When the driver circuit 174 drives the lower arm, the drive signal obtained by amplifying the PWM signal is output to the gate electrode 164 of the IGBT 330 of the lower arm corresponding thereto. When the driver circuit 174 drives the upper arm, the PWM signal is amplified upon shifting the level of the reference potential of the PWM signal to the level of the reference potential of the upper arm. This is adopted as the drive signal, and is output to the gate electrode 154 of the IGBT 328 of the upper arm corresponding thereto.

In addition, the microcomputer in the control circuit 172 performs abnormality detection (over current, over voltage, over temperature, and the like), and protects the series circuit 150. Accordingly, the control circuit 172 receives sensing information. For example, a corresponding driving unit (IC) receives information about the electric currents flowing through the emitter electrodes of each IGBT 328 and each IGBT 330 from the signal emitter electrode 155 and the signal emitter electrode 165 of each arm. Accordingly, each driving unit (IC) performs over current detection, and when the over current is detected, the switching operation of the corresponding IGBT 328, IGBT 330, is stopped, so that the IGBT 328 and the IGBT 330 are protected from over current.

The microcomputer receives information about the temperature of the series circuit 150 from a temperature sensor (not shown) provided in the series circuit 150. The microcomputer receives information about the voltage of the series circuit 150 at the direct current positive side. The microcomputer performs the over temperature detection and the over voltage detection on the basis of the information, and when the over temperature or the over voltage is detected, all the switching operation of the IGBT 328 and the IGBT 330 is stopped.

Figure 3:
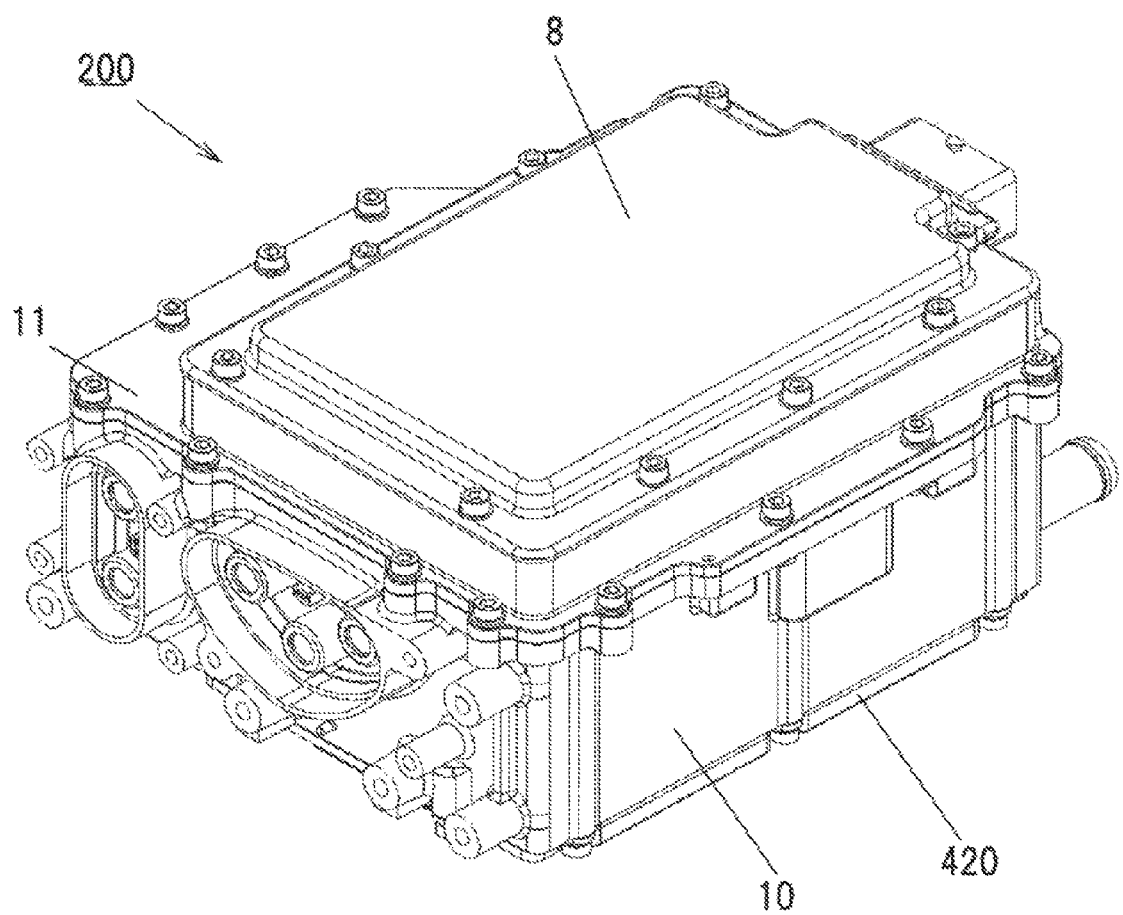
FIG. 3 is a perspective view illustrating an external appearance of a power conversion apparatus.
Figure 4:
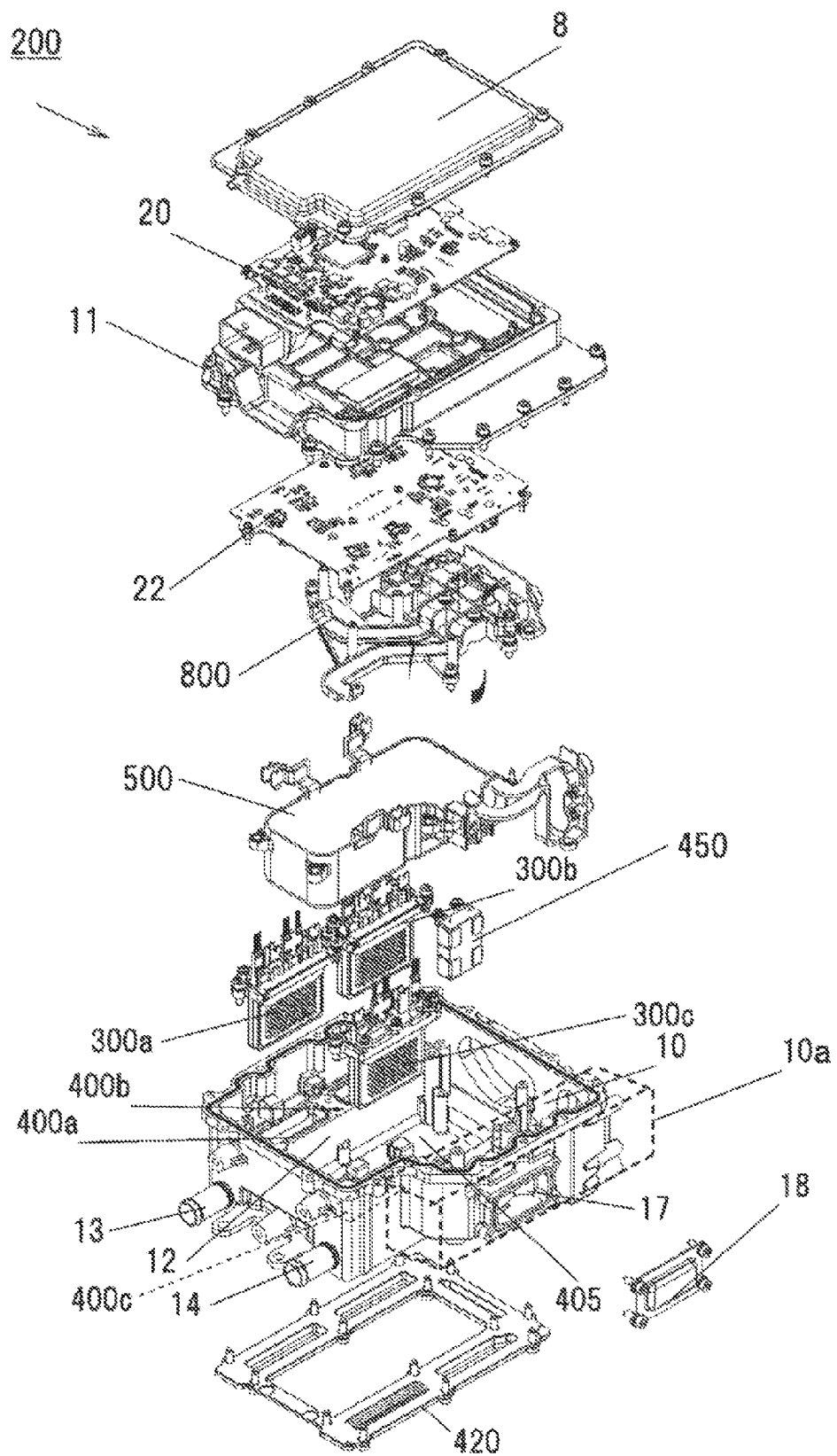
FIG. 4 is an exploded perspective view illustrating the power conversion apparatus.

FIG. 3 is a perspective view illustrating an external appearance of the power conversion apparatus 200. FIG. 4 is a figure for explaining an internal configuration of the case 10 of the power conversion apparatus 200, and is an exploded perspective view of the power conversion apparatus 200. The power conversion apparatus 200 includes a case 10 accommodating the power modules 300*a* to 300*c* and the capacitor module 500, a bus bar assembly 800 arranged above the capacitor module 500, a driver circuit board 22 arranged above the bus bar assembly 800, a metal base plate 11 fixed above the case 10, a control circuit board 20 accommodated in the metal base plate 11, and a lid 8 fixed to the upper portion of the metal base plate 11.

The case 10 is provided with a channel forming body 12 for forming a channel in which coolant such as water flows, and a lower cover 420 for closing the opening at the lower side of the channel forming body 12 is attached on the lower surface of the case 10. As described above, this is configured so as to allow the works to be performed in order from the upper side to arrange the channel forming body 12 in the lower portion of the power conversion apparatus 200, and subsequently fix necessary components such as the capacitor module 500, the bus bar assembly 800, the substrate, and the like, and this improves the productivity and the reliability.

Figure 5:
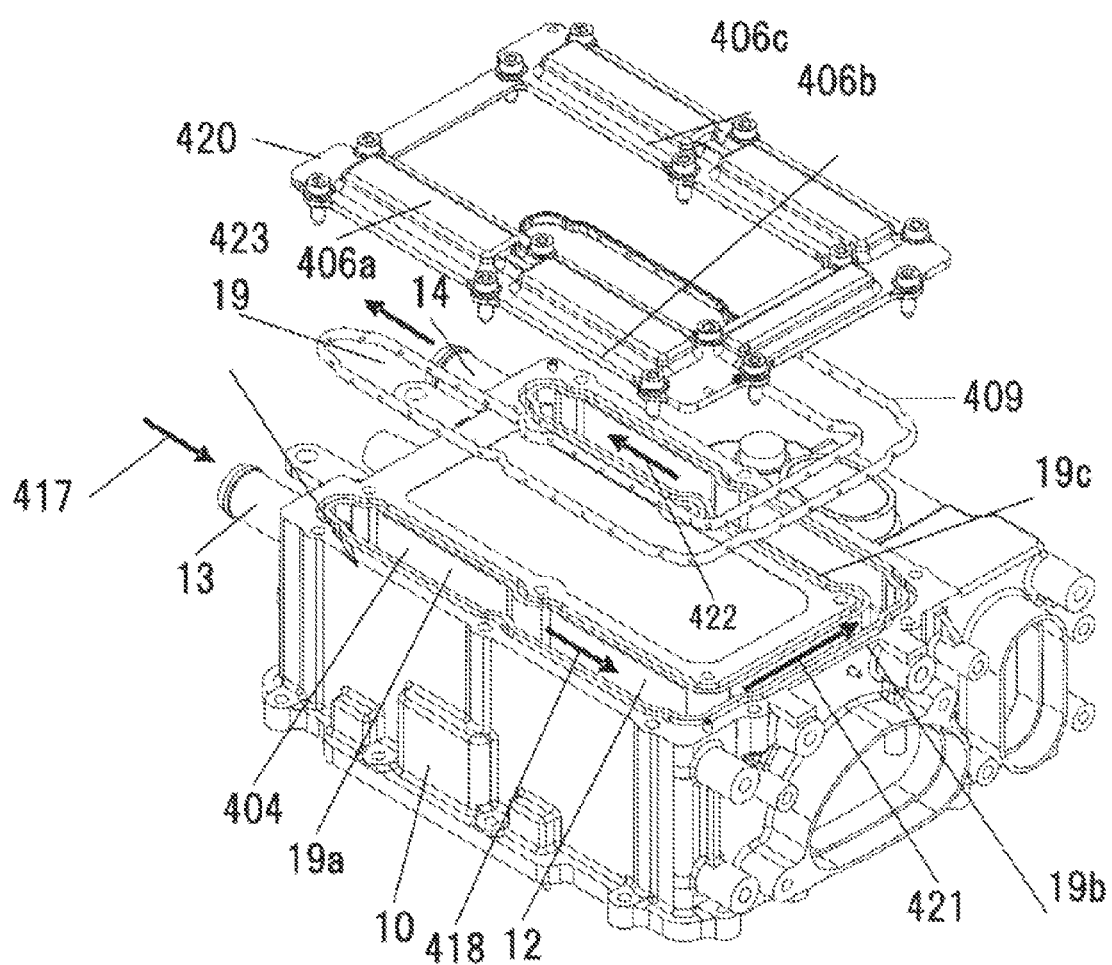
FIG. 5 is a perspective view illustrating a case of FIG. 4 when it is seen from below.

FIG. 5 is a figure for explaining the case 10 and the channel forming body 12, and is a figure showing the case 10 as illustrated in FIG. 4 when it is seen from below. The channel forming body 12 forms a U-shaped cooling channel 19 which is along the inner periphery of the three sides of the case 10. The cooling channel 19 includes a first channel unit 19*a* formed along a side in the longitudinal direction of the case 10, a second channel unit 19*b* formed along a side in the lateral direction of the case 10, and a third channel unit 19*c* formed along a side in the longitudinal direction of the channel forming body 12. The second channel unit 19*b* forms a returning channel of the cooling channel 19 forming the U shape.

An inlet pipe 13 through which the coolant flows in and an outlet pipe 14 through which the coolant flows out are provided on a side surface of the case 10 that at the opposite side to the side where the second channel unit 19*b* is formed. The coolant flows in the direction of a flow direction 417 indicated by an arrow, and flows through the first channel unit 19*a* via the inlet pipe 13 as shown by a flow direction 418. Further, the coolant flows through the second channel unit 19*b* as shown by a flow direction 421, thereafter flows through the third channel unit 19*c* as shown by a flow direction 422, and further, flows out through the outlet pipe 14 as shown by a flow direction 423. All of the first channel unit 19*a*, the second channel unit 19*b*, and the third channel unit 19*c* are formed such that the size in the depth direction is larger than the size in the width direction.

The opening unit 404 of the channel forming body 12 at the lower surface side is closed by a lower cover 420 attached to the lower surface of the case 10. A seal member 409 is provided between the lower cover 420 and the case 10 so as to maintain airtightness. The lower cover 420 is provided with protruding units 406*a* to 406*c* which protrude toward the direction opposite to the side where the cooling channel 19 is arranged. The protruding units 406*a* to 406*c* is provided in association with the power modules 300*a* to 300*c* arranged in the cooling channel 19 explained later.

As illustrated in FIG. 4, opening units 400*a* to 400*c* in communication with the cooling channel 19 are also formed at the case upper surface side of the channel forming body 12, and the opening unit 404 formed at the case lower surface side and the opening units 400*a* to 400*c* at the case upper surface side are formed to face each other, and therefore, this configuration can be easily manufactured by aluminum casing. The channel forming body 12 and the case 10 are integrally made by casting aluminum material, so that the thermal conductivity of the entire power conversion apparatus 200 is improved, and the efficiency of cooling is improved. Further, by integrally making the channel forming body 12 and the case 10, the mechanical strength can also be improved.

Back to FIG. 4, on the upper surface of one of the sides (side where the first channel unit 19*a* of FIG. 5 is formed) of the channel forming body along the longitudinal direction of the case 10, an opening unit 400*a* and an opening unit 400*b* are formed along the side surface of the case 10, and as shown by a broken line, an opening unit 400*c* is formed on the upper surface at the other side thereof (side where the second channel unit 19*b* of FIG. 5 is formed). Each of the opening units 400*a* to 400*c* is closed by the inserted power modules 300*a* to 300*c*. An accommodating space 405 for accommodating the capacitor module 500 is formed between the channel forming body 12 at both sides. By accommodating the capacitor module 500 in such accommodating space 405, the capacitor module 500 is cooled by coolant flowing through the cooling channel 19. The capacitor module 500 is arranged to be enclosed by the cooling channel 19 (the first to third channel units 19*a* to 19*c*) as shown in FIG. 5, and therefore, the capacitor module 500 is efficiently cooled.

As described above, the cooling channel 19 is formed along the outer side surface of the capacitor module 500, and therefore, the cooling channel 19, the capacitor module 500, and the power modules 300*a* to 300*c* are arranged in an organized manner, and the entire size is further reduced. In addition, the first channel unit 19*a* and the third channel unit 19*c* are arranged along the longer sides of the capacitor module 500, and the distance between the power modules 300*a* to 300*c* inserted and fixed in the cooling channel 19 and the capacitor module 500 is maintained at a substantially same distance. Therefore, the circuit constant of the power module circuit and the smoothing capacitor can easily maintain balance in each phase of the three phases, which makes a circuit configuration that can easily reduce the spike voltage.

The bus bar assembly 800 is arranged above the capacitor module 500. The bus bar assembly 800 includes an alternate current bus bar 802 and a holding member, and holds the electric current sensor 180. The driver circuit board 22 is arranged above the bus bar assembly 800. The metal base plate 11 is arranged between the driver circuit board 22 and the control circuit board 20.

The metal base plate 11 is fixed to the case 10. The metal base plate 11 functions as an electromagnetic shield for the circuit group mounted on the driver circuit board and the control circuit board 20, releases heat generated by the driver circuit board 22 and the control circuit board 20, and cools the driver circuit board 22 and the control circuit board 20.

A cap 18 is a member for closing a work window for connecting a terminal extended from the DC-DC converter. The lid 8 fixed to the metal base plate 11 has a function of protecting the control circuit board 20 from external electromagnetic noise.

The case 10 according to the present embodiment is such that a portion where the channel forming body 12 is accommodated is in a substantially rectangular solid shape, but a protruding accommodating unit 10*a* is formed from one side surface side of the case 10. The protruding accommodating unit 10*a* includes a terminal extended from the DC-DC converter, a direct current bus bar (not shown), and a resistor 450. In this case, the resistor 450 is a resistor device for discharging the charges accumulated in the capacitor device of the capacitor module 500. As described above, the electric circuit components between the battery 136 and the capacitor module 500 are integrated in the protruding accommodating unit 10*a*, and therefore, this can suppress complexity of the wiring, and contribute to the reduction of the size of the entire apparatus.

The configuration of the power modules 300*a* to 300*c* used for the inverter circuit 140 will be explained with reference to FIGS. 6 to 16. It should be noted that, all of the power modules 300*a* to 300*c* have the same structure, and therefore, the structure of the power module 300*a* will be explained representing each of them. The cross sectional views of FIGS. 7, 8, 12 and 14 to 16 are cross sectional schematic views (schematic diagrams) taken along line A-A of FIG. 6. It should be noted that they are also cross sectional schematic views (schematic diagrams) taken along line B-B, and reference symbols in parentheses are given to the constituent elements shown in the cross section taken along line B-B. In the cross sections taken along line A-A and line B-B, a positioning pin 601 and a positioning hole 382*c* explained later would not appear, but are shown for the sake of convenience.

Figure 2:
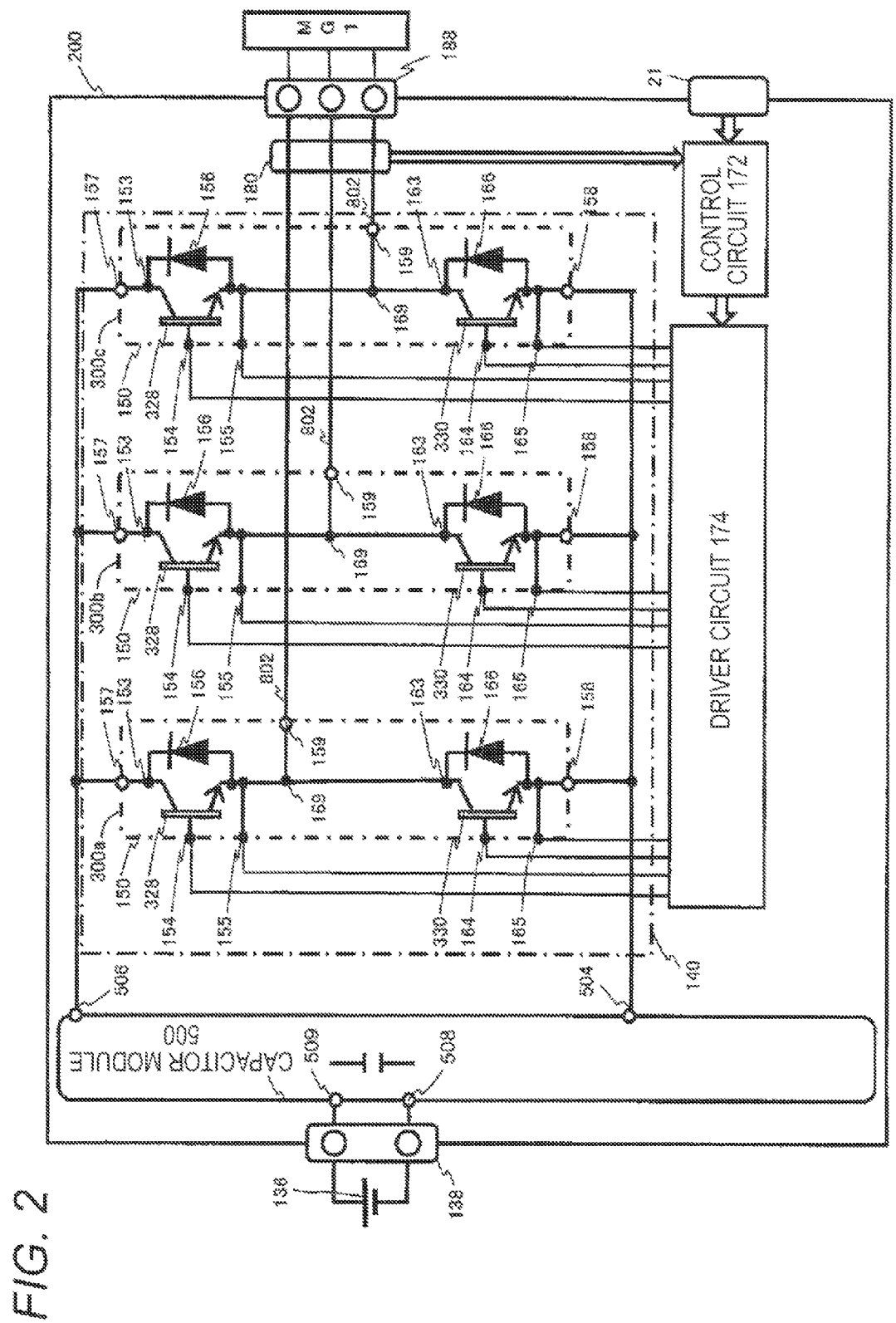
FIG. 2 is a figure for explaining a configuration of an electric circuit of an inverter circuit.
Figure 6:
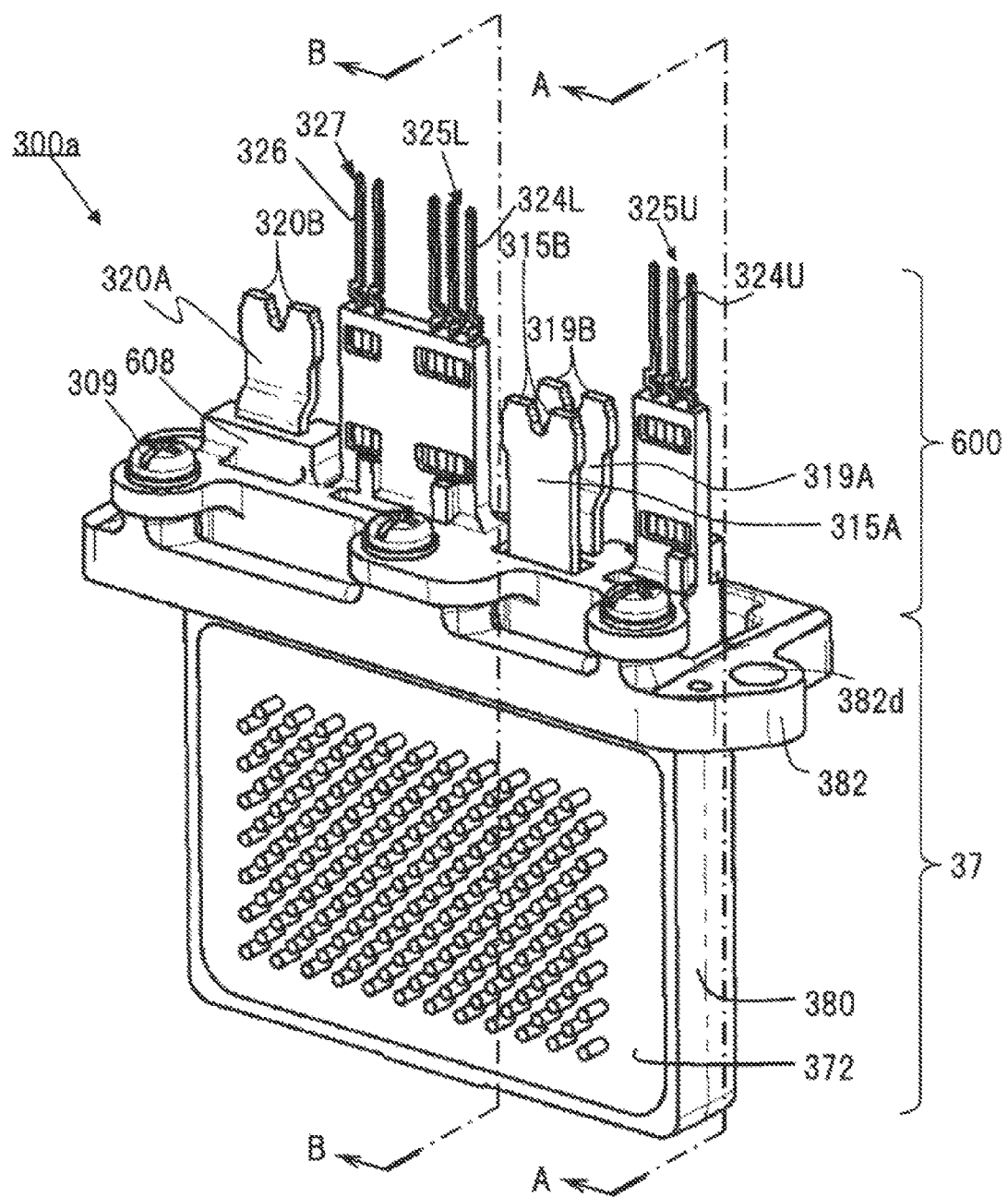
FIG. 6 is a perspective view illustrating a power module.

In FIGS. 6 to 10, 15 and 16, the signal terminal 325U corresponds to the gate electrode 154 as illustrated in FIG. 2, and the signal terminal 325L corresponds to the gate electrode 164 as illustrated in FIG. 2. In FIG. 6, the signal terminal 327 corresponds to the signal emitter electrodes 155, 165. The direct current positive terminal 315B is the same as the positive terminal 157 as illustrated in FIG. 2, and the direct current negative terminal 319B is the same as the negative terminal 158 as illustrated in FIG. 2. The alternate current terminal 320B is the same as the alternate current terminal 159 as illustrated in FIG. 2.

Figure 7:
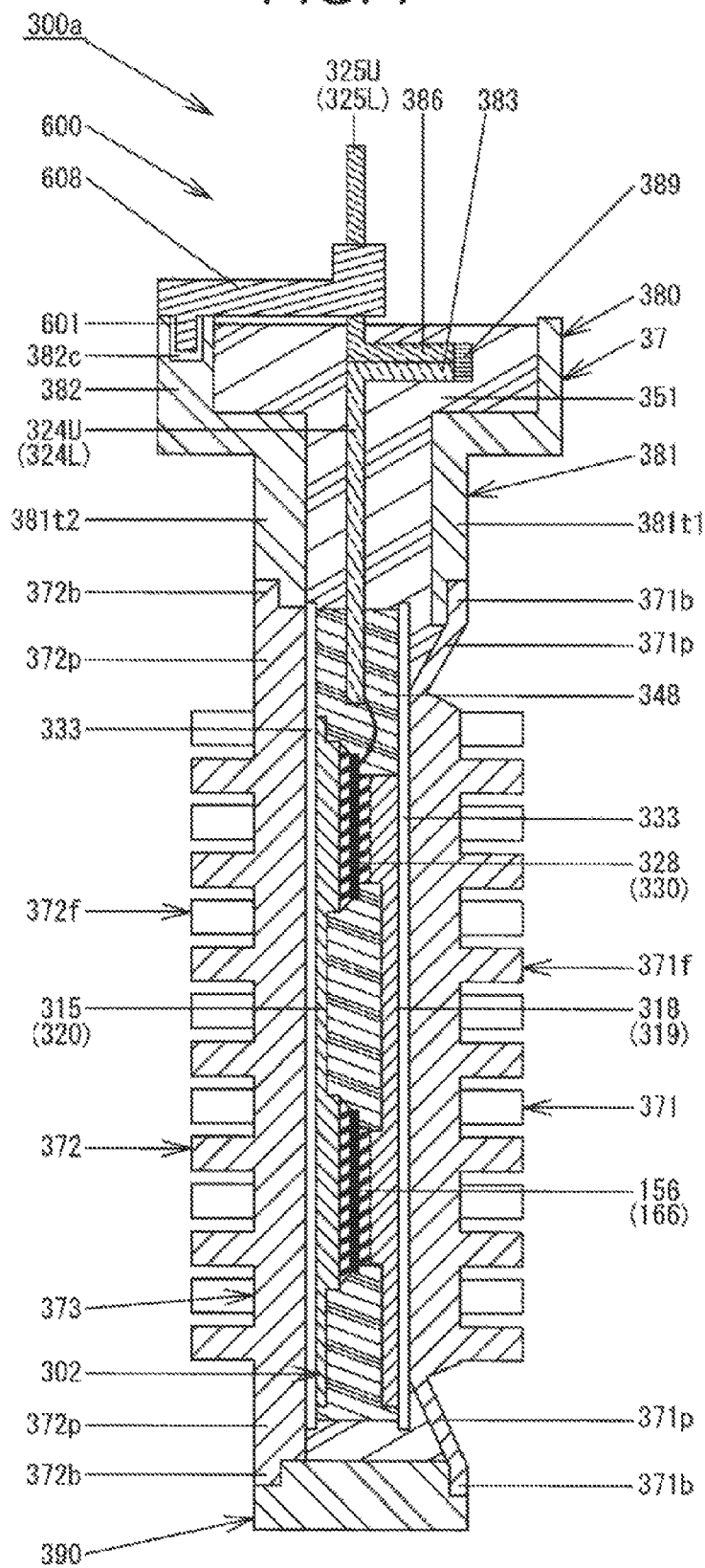
FIG. 7 is a cross sectional schematic view illustrating the power module.
Figure 8:
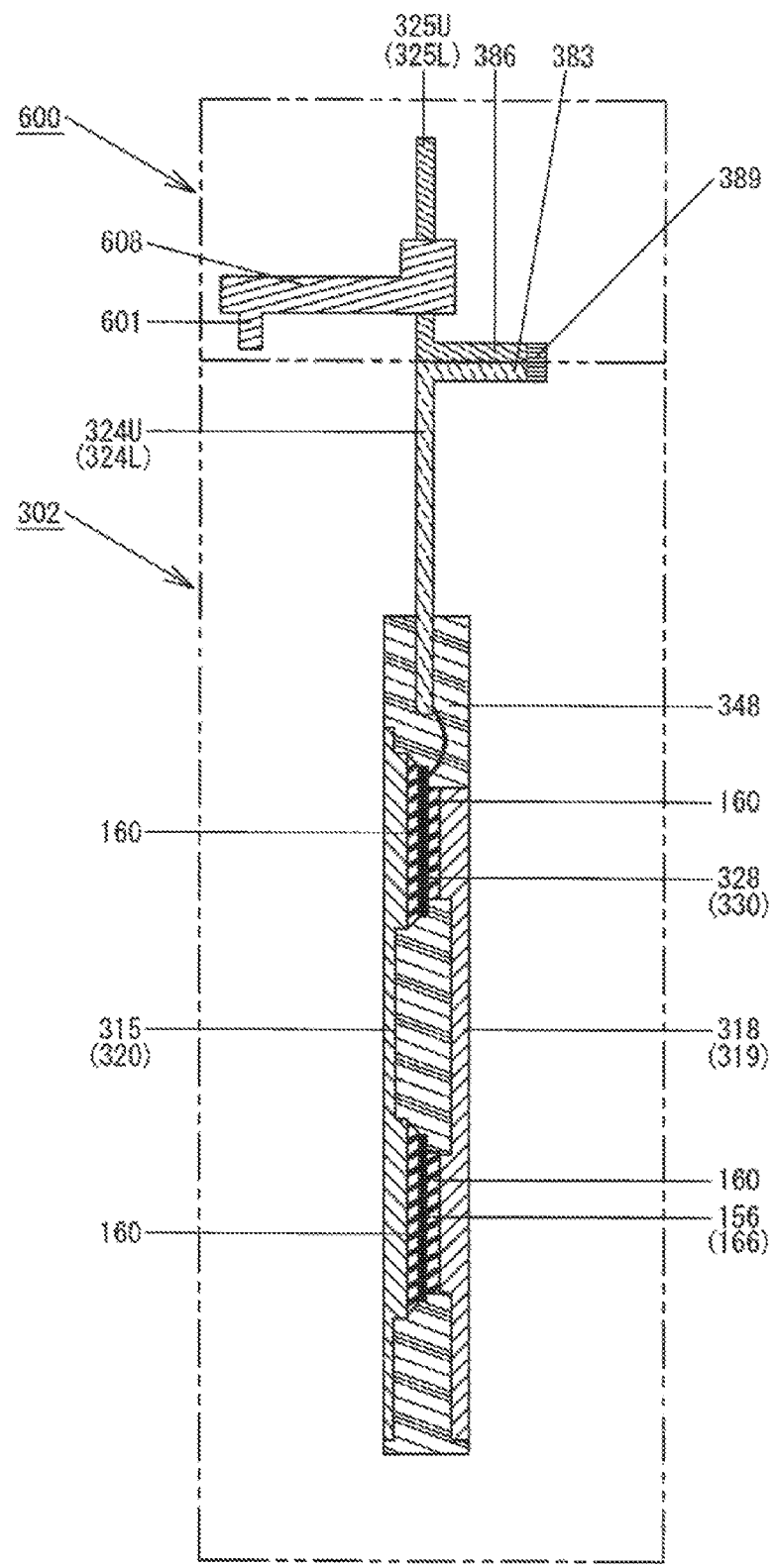
FIG. 8 is a cross sectional schematic view illustrating a module primary encapsulant body and a supporting mold body.
Figure 9:
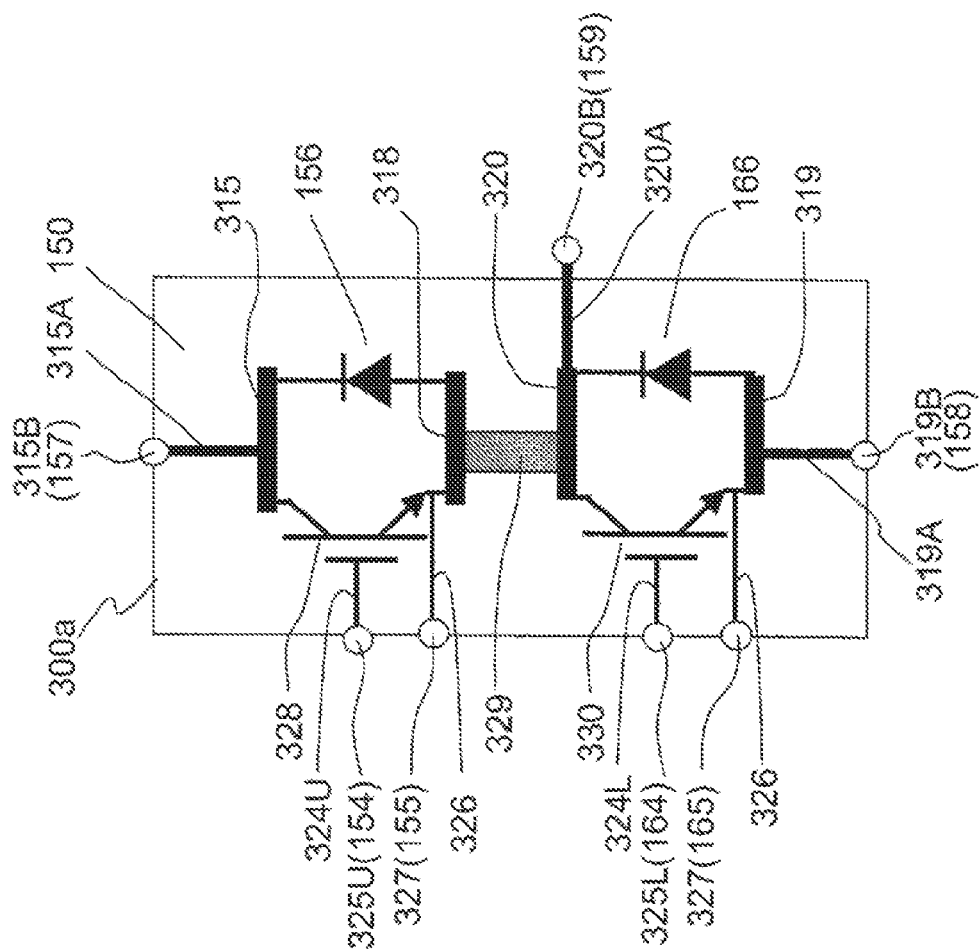
FIG. 9 is a circuit diagram illustrating a circuit configuration of the power module.
Figure 10:
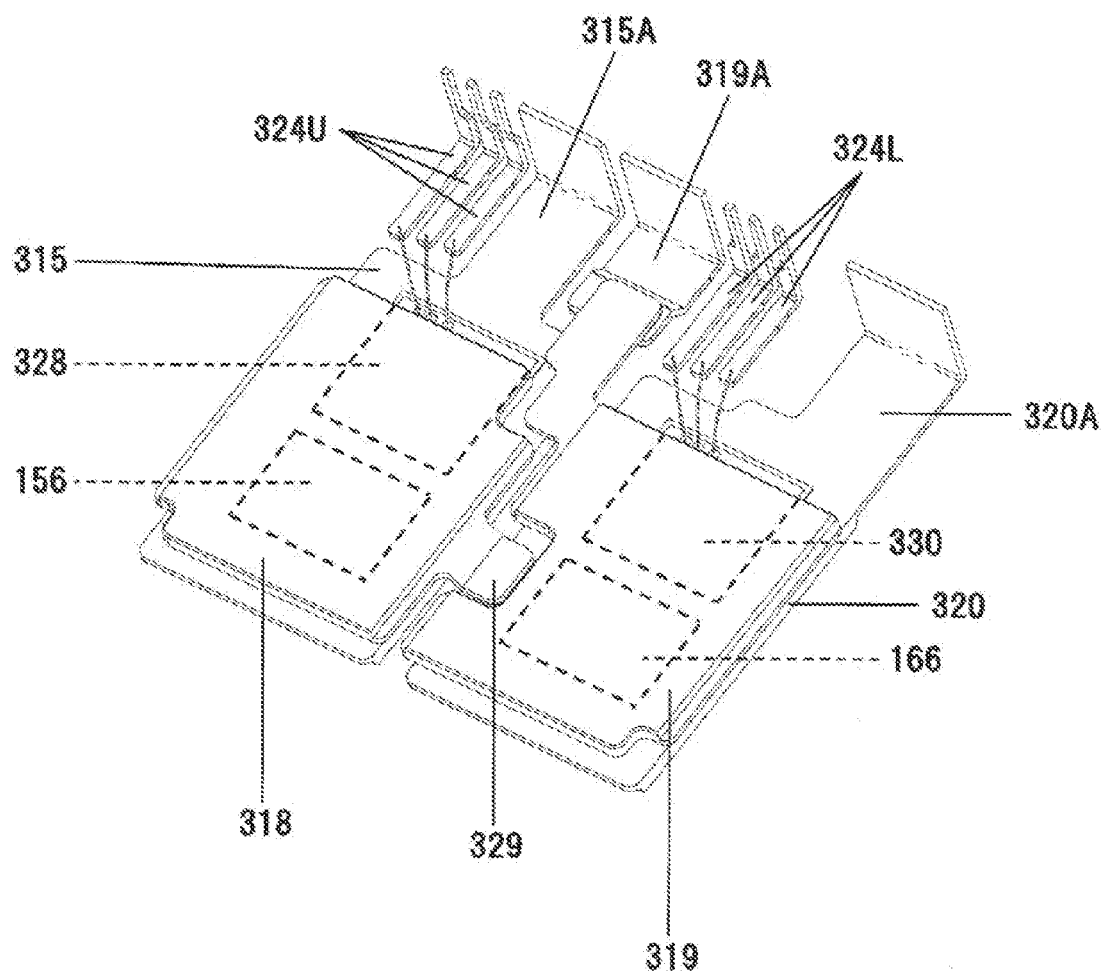
FIG. 10 is a perspective view illustrating a conductive plate assembly from which a module case, an insulating sheet, and first and second sealing resins are removed.

FIG. 6 is a perspective view illustrating the power module 300*a*. FIG. 7 is a cross sectional schematic view illustrating the power module 300*a*. FIG. 8 is a cross sectional schematic view illustrating a module primary encapsulant body 302 accommodated in the power module 300*a* and a supporting mold body 600 connected to the module primary encapsulant body 302. FIG. 9 is a circuit diagram illustrating the circuit configuration of the power module 300*a*. FIG. 10 is a perspective view illustrating the conductive plate assembly, wherein the module case 37 of the power module 300*a*, the insulating sheet 333, and the first and second sealing resins 348, 351 are removed to help understanding. In FIG. 10, a signal wire 326 is not shown.

As illustrated in FIGS. 6 and 7, the power module 300*a* includes a metallic module case 37, and in the module case 37, a module primary encapsulant body 302 (see FIG. 8) is accommodated. The module primary encapsulant body 302 is configured to include power semiconductor devices (IGBT 328, IGBT 330, diode 156, diode 166) constituting the series circuit 150 as shown in FIGS. 2 and 9.

The circuit configuration of the power module will be explained will be explained with reference to FIG. 9. As illustrated in FIG. 9, the collector electrode of the IGBT 328 at the upper arm side and the cathode electrode of the diode 156 at the upper arm side are connected via the conductive plate 315. Likewise, the collector electrode of the IGBT 330 at the lower arm side and the cathode electrode of the diode 166 at the lower arm side are connected via a conductive plate 320. The emitter electrode of the IGBT 328 at the upper arm side and the anode electrode of the diode 156 at the upper arm side are connected via a conductive plate 318. Likewise, the emitter electrode of the IGBT 330 at the lower arm side and the anode electrode of the diode 166 at the lower arm side are connected via a conductive plate 319. The conductive plates 318 and 320 are connected via an intermediate electrode 329. With such circuit configuration, the series circuit 150 of the upper/lower arms is formed.

As illustrated in FIGS. 8 and 10, the power semiconductor devices (IGBT 328, IGBT 330, diode 156, diode 166) have plate-like flat structure, the electrodes of the power semiconductor device are formed on the front and back surfaces.

The electrodes of the power semiconductor device are sandwiched by the conductive plate 315 and the conductive plate 318, or the conductive plate 320 and the conductive plate 319 provided to face the electrode surfaces thereof. More specifically, the conductive plate 315 and the conductive plate 318 are in laminated arrangement in which they are arranged substantially parallel to each other to face each other with the IGBT 328 and the diode 156 interposed therebetween. Likewise, the conductive plate 320 and the conductive plate 319 are in laminated arrangement in which they are arranged substantially parallel to each other to face each other with the IGBT 330 and the diode 166 interposed therebetween. As illustrated in FIG. 10, the conductive plate 320 and the conductive plate 318 are connected via the intermediate electrode 329. With this connection, the upper arm circuit and the lower arm circuit are electrically connected, and an upper/lower arms series circuit is formed.

The conductive plate 315 at the direct current side and the conductive plate 320 at the alternate current side are arranged substantially in the same plane. The collector electrode of the IGBT 328 at the upper arm side and the cathode electrode of the diode 156 at the upper arm side are fixed to the conductive plate 315. The collector electrode of the IGBT 330 at the lower arm side and the cathode electrode of the diode 166 at the lower arm side are fixed to the conductive plate 320. Likewise, the conductive plate 318 at the alternate current side and the conductive plate 319 at the direct current side are arranged substantially in the same plane. The emitter electrode of the IGBT 328 at the upper arm side and the anode electrode of the diode 156 at the upper arm side are fixed to the conductive plate 318. The emitter electrode of the IGBT 330 at the lower arm side and the anode electrode of the diode 166 at the lower arm side are fixed to the conductive plate 319.

Each conductive plates 315, 318, 319, 320 according to the present embodiment is preferably a wire for a high electric current circuit, and is preferably made of a material of which thermal conductivity is high such as pure copper, copper alloy, or the like and of which electric resistance is low, and the thickness thereof is preferably equal to or more than 0.5 mm.

As illustrated in FIG. 8, each of conductive plates 315, 318, 319, 320 is formed with a device fixing unit so as to protrude to the power semiconductor device side. Each power semiconductor device is fixed to the device fixing unit via the metal bonding material 160. The metal bonding material 160 is, for example, low temperature sintering joining materials including silver sheet and small metallic particles, or Pb-free solder of which thermal conductivity is high and of which environment performance is high, or, for example, Sn—Cu solder, Sn—Ag—Cu solder, Sn—Ag—Cu—Bi solder, or the like.

Each of conductive plates 315, 318, 319, 320 also serves as the function of heat sink, and therefore, the external size of the device fixing unit is preferably, substantially the same as the external size of the power semiconductor device, or preferably formed to be larger than the external size of the power semiconductor device. Therefore, the thermal conductive path can be ensured, and the heat radiation performance is expected to improve.

In the present embodiment, the external size of the device fixing unit of the conductive plate 315 and the conductive plate 320 is formed to be larger than the external size of the power semiconductor device, and the external size of the device fixing unit of the conductive plate 318 and the conductive plate 319 is substantially the same as the external size of the power semiconductor device, but is formed to be slightly smaller than the external size of the power semiconductor device. Therefore, the conductive plates 318, 319 are arranged at the upper side, and the conductive plates 315, 320 are arranged at the lower side, and when the conductive plates 315, 318, 319, 320 are collectively connected to the power semiconductor device by solder in this state, the solder can be prevented from flowing and dropping to the lower side. As a result, the solder can be prevented from short-circuited with the solder and the conductive plate at the lower side because of the solder flows and falls to the lower side.

The signal wire 324U and the signal wire 324L for connection with the driver circuit board 22 are connected with the gate electrode of the power semiconductor device by wire bonding, ribbon bonding, or the like. The wire and the ribbon are preferably aluminum. Using solder and the like instead of the wire and the ribbon, the signal wire 324U and the signal wire 324L may be connected to the gate electrode. The signal wire 324U and the signal wire 324L preferably use pure copper or copper alloy. It should be noted that the signal wire 324U and the signal wire 324L are integrally formed with the conductive plates 315, 320, and the like.

The conductive plate assembly connected to the signal wires 324U, 324L is arranged in a mold for transfer mold, and the mold is filled with a first sealing resin 348 such as epoxy resin, and the first sealing resin 348 is formed, whereby the conductive plate assembly including the power semiconductor device is sealed by the first sealing resin 348, so that the module primary encapsulant body 302 is formed. When the transfer mold is performed, the outer side surfaces of the conductive plates 315, 318, 319, 320 arranged on both sides of the power semiconductor device are exposed by the first sealing resin 348, and become heat radiation surface to the module case 37. The size of the heat radiation surface is preferably larger than the external size of the device fixing unit. Accordingly, the thermal conduction path is ensured, and the heat radiation performance is expected to improve. It should be noted that the entire outer side surfaces of the conductive plates 315, 318, 319, 320 facing the inner surface of the module case 37 may be exposed from the first sealing resin 348 to be used as heat radiation surface, or a portion corresponding to each power semiconductor device may be exposed to be used as heat radiation surface.

As illustrated in FIG. 8, the conductive plate 315 and the like is sealed by the first sealing resin 348 while the heat radiation surface thereof is exposed, and, as illustrated in FIG. 7, the insulating sheet 333 having high heat conductivity is bonded to the heat radiation surface by thermocompression bonding. In the present embodiment, the insulating sheet 333 in which ceramic particles are dispersed in epoxy resin is employed. The module primary encapsulant body 302 sealed by the first sealing resin 348 is inserted into the module case 37, and the wide surface of the module case 37 is pressurized, so that it is bonded on the inner surface of the module case 37 by thermocompression bonding with the insulating sheet 333 interposed therebetween. The space remaining in the module case 37 is filled with the second sealing resin 351, so that the module case 37 is sealed. The configuration and method for crimping the module primary encapsulant body 302 to the module case 37 by pressurizing the module case 37 will be explained later.

As described above, the conductive plate 315 and the like are bonded to the inner wall of the module case 37 by thermocompression bonding with the insulating sheet 333 interposed therebetween, whereby the space between the conductive plate 315 and the like and the inner wall of the module case 37 can be reduced, and the heat generated by the power semiconductor device can be efficiently transmitted to the module case 37, and the heat can be radiated from the pin fins vertically arranged on the module case 37. Further, the insulating sheet 333 is given a certain thickness and flexibility, and the insulating sheet 333 can absorb generation of the thermal stress, and it is preferable for use with the power conversion apparatus 200 for a vehicle where the temperature greatly changes.

Subsequently, the supporting mold body 600 will be explained, which is made by holding, with resin, the driver circuit 174, the capacitor module 500 or the motor generator MG1, and the relay wires connected to the wires including the terminal of the module primary encapsulant body 302. As illustrated in FIG. 6, outside of the module case 37, a metallic direct current positive wire 315A and a direct current negative wire 319A for electrically connecting with the capacitor module 500 are provided, and at the end portions thereof, a direct current positive terminal 315B (157) and a direct current negative terminal 319B (158) are respectively formed. Further, outside of the module case 37, a metallic alternate current wire 320A for providing alternate current electric power to the motor generator MG1 is provided, and at an end thereof, an alternate current terminal 320B (159) is formed. As illustrated in FIG. 9, the direct current positive wire 315A is connected to the conductive plate 315, and the direct current negative wire 319A is connected to the conductive plate 319, and the alternate current wire 320A is connected to the conductive plate 320.

As illustrated in FIG. 6, outside of the module case 37, further, the metallic signal wires 324U, 324L, 326 for electrically connecting to the driver circuit 174 are provided, and at the end portions thereof, a signal terminal 325U (154), a signal terminal 325L (164), and a signal terminal 327 (155, 165) are respectively formed. As illustrated in FIG. 9, the signal wire 324U is connected to the IGBT 328, and the signal wire 324L is connected to the IGBT 330.

As illustrated in FIG. 6, the direct current positive wire 315A, the direct current negative wire 319A, alternate current wire 320A, the signal wire 324U and the signal wire 324L are integrally formed as the supporting mold body 600 while being insulated from each other by a wire insulating unit 608 formed by resin material. The wire insulating unit 608 also serves as a support member for supporting each wire, and the resin material used for this is preferably thermosetting resin or thermoplastics resin having insulating property. In the present embodiment, polyphenylene sulfide (PPS) which is thermoplastics resin is employed. Accordingly, this can ensure insulating property between the direct current positive wire 315A, the direct current negative wire 319A, the alternate current wire 320A, and the signal wire 324U and the signal wire 324L, and high density wires can be made.

As illustrated in FIG. 6, the direct current positive wire 315A and the direct current negative wire 319A are laminated to face each other with the wire insulating unit 608 interposed therebetween to form a shape extending substantially parallel to each other. With such arrangement and shape, the electric currents flowing momentarily during switching operation of the power semiconductor device flow facing each other and in the opposite directions. Therefore, the magnetic field generated by the electric currents cancel each other, and with this action, low inductance can be achieved. It should be noted that the alternate current wire 320A and the signal wires 324U, 324L also extend in the same directions as the direct current positive wire 315A and direct current negative wire 319A.

As illustrated in FIG. 8, the supporting mold body 600 is joined and integrated with the module primary encapsulant body 302 at the connection unit 389 by metal junction. The metal junction of the module primary encapsulant body 302 and the supporting mold body 600 at the connection unit 389 may use, for example, TIG welding and the like.

The direct current positive wire 315A, the direct current negative wire 319A, the alternate current wire 320A, and supporting mold body side connection terminal 386 of each of the signal wire 324U and the signal wire 324L are arranged in a row at the side of the supporting mold body 600 of the connection unit 389. On the other hand, the direct current positive wire 315A, the direct current negative wire 319A, the alternate current wire 320A, and the device side connection terminal 383 of each of the signal wire 324U and the signal wire 324L are arranged in a row at the side of the module primary encapsulant body 302 of the connection unit 389. The supporting mold body side connection terminal is formed on each of the wires 319A, 320A, 324U, 324L is formed, but for the sake of convenience, the same reference numerals are attached. The same reference numerals are also attached to the device side connection terminal.

Figure 11:
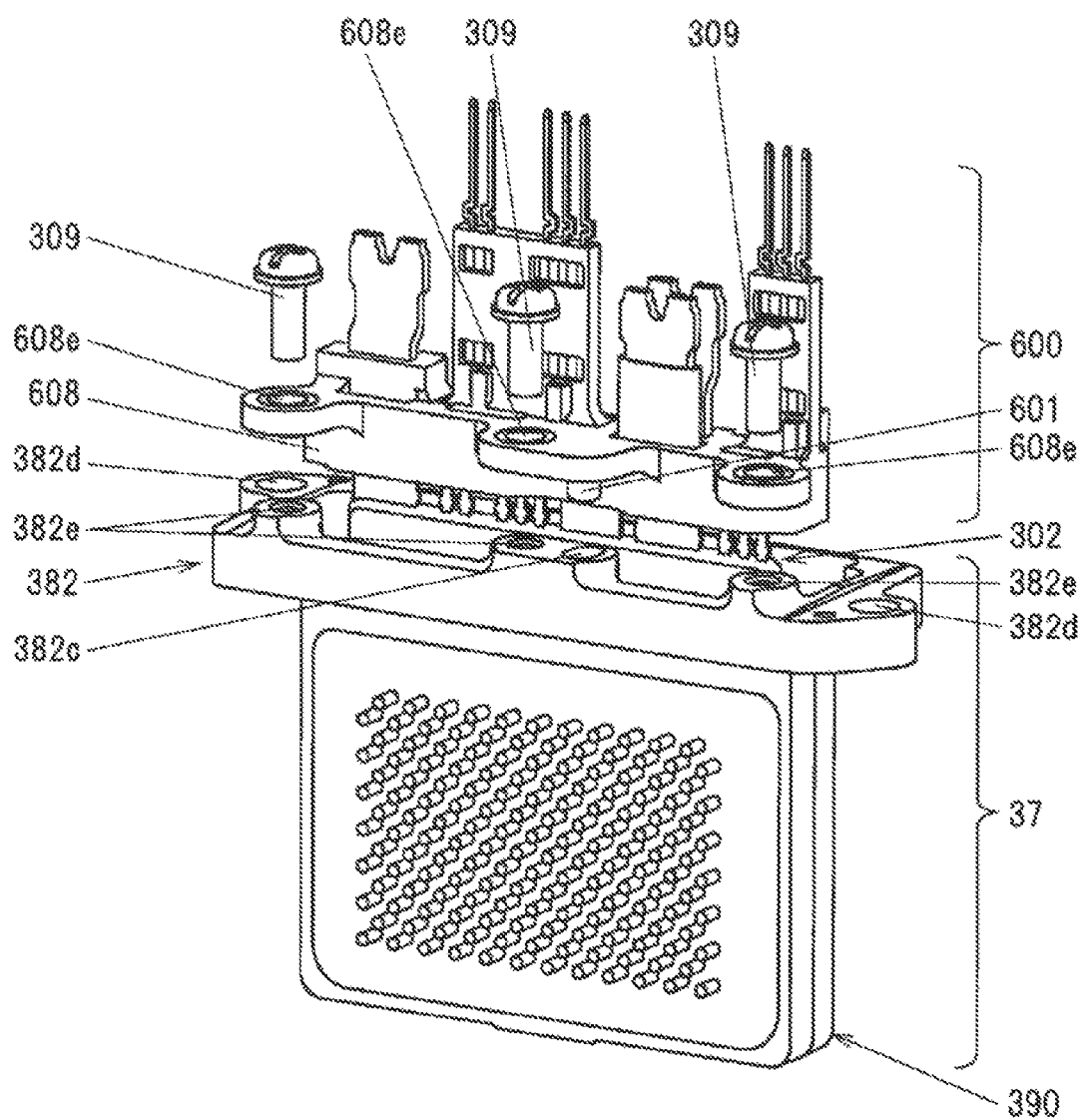
FIG. 11 is a perspective view illustrating how the module primary encapsulant body is inserted into the module case.

FIG. 11 is a perspective view illustrating how the module primary encapsulant body 302 is inserted into the module case 37. As illustrated in FIG. 11, the supporting mold body 600 penetrates through the hole 608e provided in the wire insulating unit 608, and is fixed to the mole case 37 by the screw 309 attached to the screw hole 382e of the module case 37. The wire insulating unit 608 is provided with a positioning pin 601 capable of engaging with the positioning hole 382c of the module case 37 explained later, in such a manner that the positioning pin 601 protrudes downward.

As illustrated in FIG. 7, the connection unit 389 where the module primary encapsulant body 302 and the supporting mold body 600 are connected by metal joint is sealed in the module case 37 by the second sealing resin 351. Accordingly, the insulating distance required between the connection unit 389 and the module case 37 can be ensured in a stable manner, and therefore, as compared with a case where no sealing is used, the size of the power module 300a can be reduced.

Figure 12:
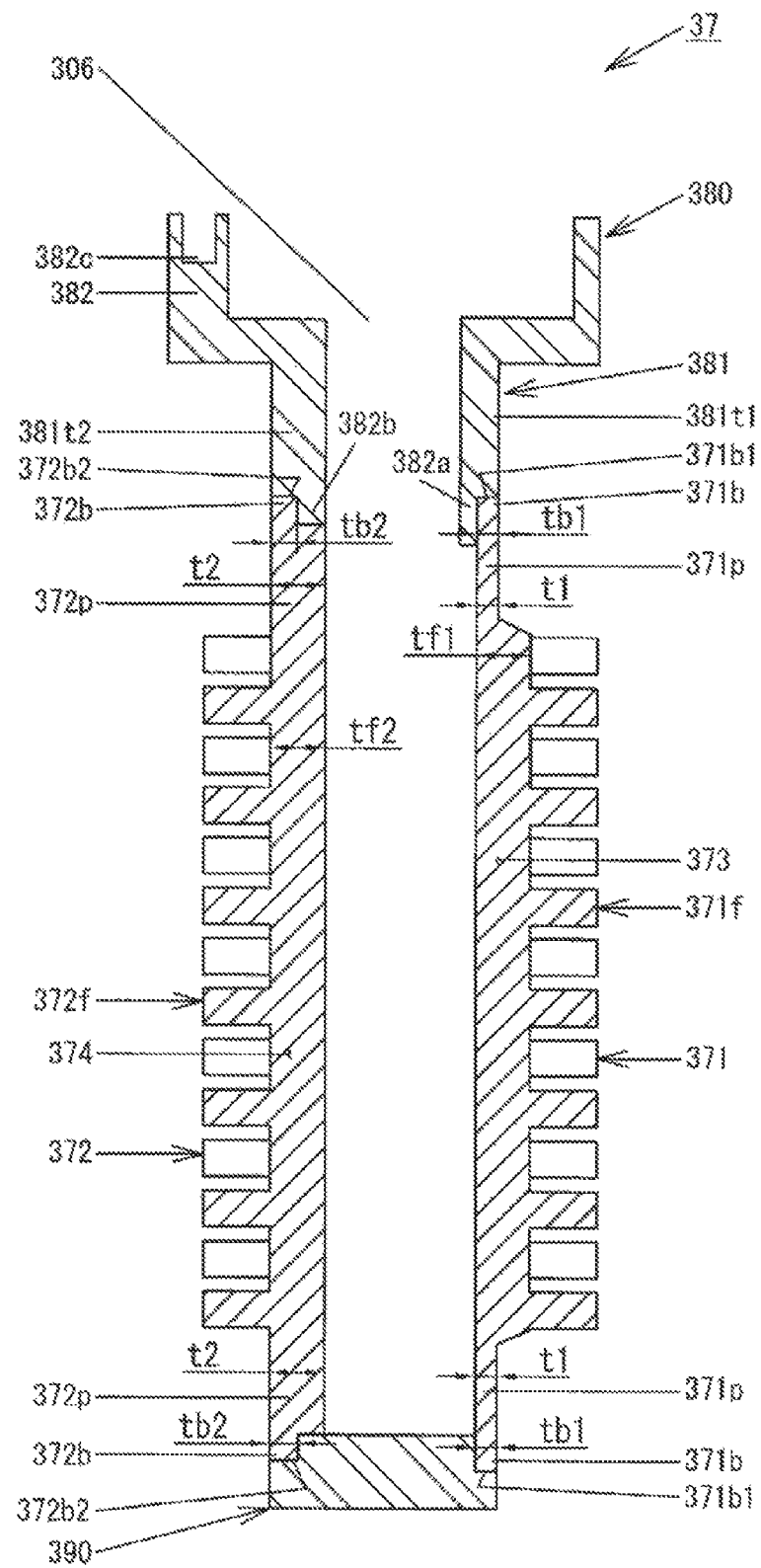
FIG. 12 is a cross sectional schematic view illustrating a module case.
Figure 13:
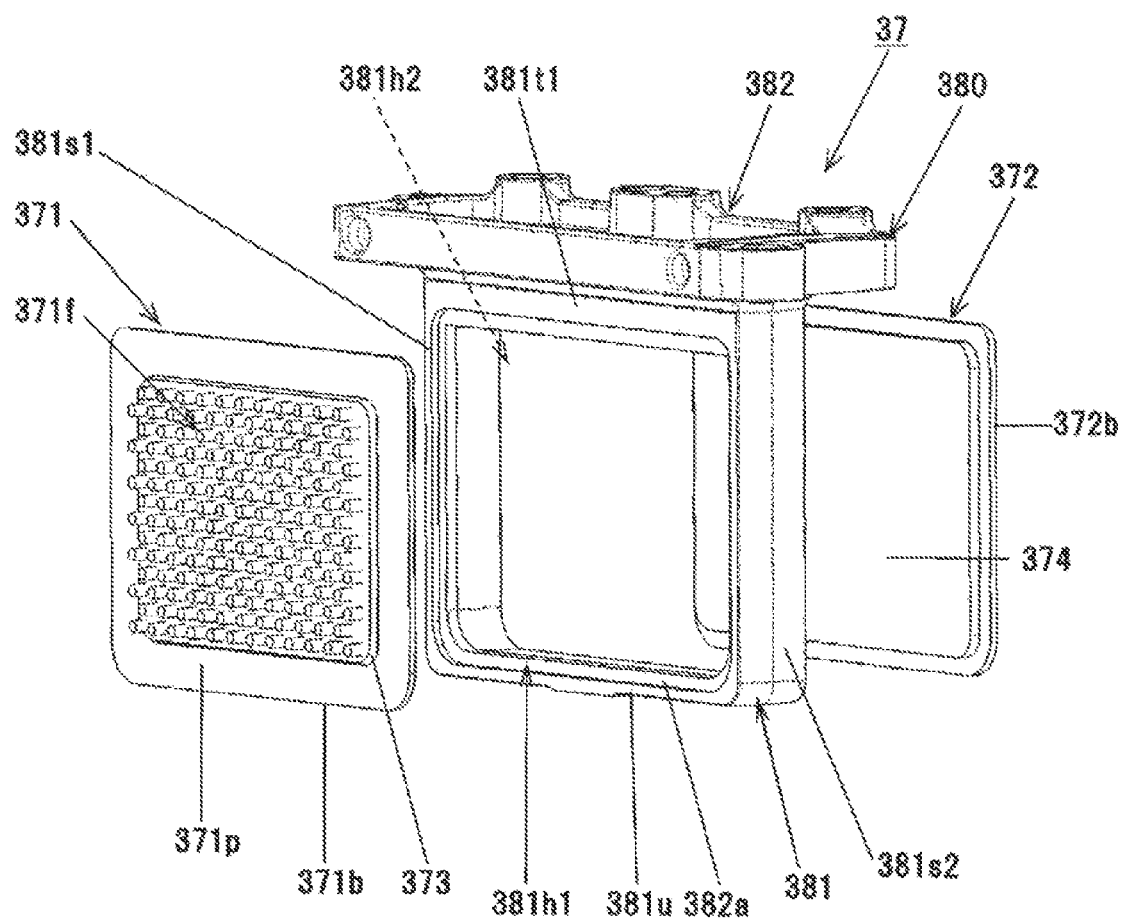
FIG. 13 is an exploded perspective view illustrating the module case.

Subsequently, the configuration of the module case 37 will be explained with reference to FIGS. 11 to 14. FIG. 12 is a cross sectional schematic view illustrating the module case 37. FIG. 13 is an exploded perspective view illustrating the module case 37.

As illustrated in FIGS. 11 and 12, the module case 37 is a CAN-type cooling device in a cylindrical shape having a bottom but of which upper surface is open. As illustrated in FIGS. 12 and 13, the module case 37 according to the present embodiment is formed as follows. The frame body 380 and the first heat sink 371 and the second heat sink 372 arranged to face each other are manufactured individually by cold forging operation, die cast, and cutting operation, and each of the first and second heat sinks 371, 372 are welded to the frame body 380 by solid-state welding. In the present embodiment, from the perspective of mass production, reduction of weight, and improvement of heat radiation performance, the first heat sink 371 and the second heat sink 372 are formed with pure aluminum material having a heat conductivity higher than the frame body 380, and the frame body 380 is formed with aluminum alloy material having a higher degree of rigidity than the first heat sink 371 and the second heat sink 372.

As illustrated in FIGS. 12 and 13, the first heat sink 371 and the second heat sink 372 respectively include the first fin base 373 and the second fin base 374 in rectangular flat plate shape, and one surface of the first and second fin bases 373, 374 is arranged with multiple pin fins in a staggered manner.

As illustrated in FIGS. 12 and 13, at the center of the first heat sink 371, a heat radiation fin unit 371$f$ is provided. Multiple pin fins are vertically installed on the heat radiation fin unit 371$f$. At the external peripheral edge of the first heat sink 371, a protruding matching unit 371$b$, which is a joint portion with the frame body 380, is provided. Between the protruding matching unit 371$b$ and the heat radiation fin unit 371$f$, a thin fin peripheral edge unit 371$p$ is provided to enclose the heat radiation fin unit 371$f$.

Although not shown in FIG. 13, a heat radiation fin unit 372$f$ is also provided at the center of the second heat sink 372. Multiple pin fins are vertically installed on the heat radiation fin unit 372$f$. On the external peripheral edge of the second heat sink 372, a protruding matching unit 372$b$, which is a joint portion with the frame body 380, is provided. Between the protruding matching unit 372$b$ and the heat radiation fin unit 372$f$, a fin peripheral edge unit 372$p$ is provided to enclose the heat radiation fin unit 372$f$. As explained later, the protruding matching unit 372$b$ is formed to be thinner than the fin peripheral edge unit 372$p$, and the external peripheral edge of the second fin base 374 is in a step like shape.

As illustrated in FIG. 12, the first heat sink 371 is formed such that the material thickness t1 of the fin peripheral edge unit 371$p$ is thinner than the material thickness tf1 of the base of the heat radiation fin unit 371$f$ (t1<tf1), and the material thickness tb1 of the protruding matching unit 371$b$ is the same thickness as the material thickness t1 of the fin peripheral edge unit 371$p$ (tb1=t1).

The second heat sink 372 is formed such that the material thickness t2 of the fin peripheral edge unit 372$p$ is the same thickness as the material thickness tf2 of the base of the heat radiation fin unit 372$f$ (t2=tf2), and the material thickness tb2 of the protruding matching unit 372$b$ is thinner than the material thickness t2 of the fin peripheral edge unit 372$p$ (tb2<t2).

The material thickness to of the base of the heat radiation fin unit 371$f$ is configured to be the same thickness as the material thickness tf2 of the base of the heat radiation fin unit 372$f$ (tf1=tf2), so that the heat radiation effects of the first heat sink 371 and the second heat sink 372 become the same. The material thickness tb1 of the protruding matching unit 371$b$ of the first heat sink 371 is configured to be the same thickness as the material thickness tb2 of the protruding matching unit 372$b$ of the second heat sink 372 (tb1=tb2), so that the first heat sink 371 and the second heat sink 372 can be joined to the frame body 380 under the same condition.

As described above, t1<tf1=tf2 holds, and t2=tf2=tf1 holds, and therefore, the thickness t1 of the fin peripheral edge unit 371p of the first heat sink 371 is configured to be thinner than the thickness t2 of the fin peripheral edge unit 372p of the second heat sink 372 (t1<t2).

Figure 14:
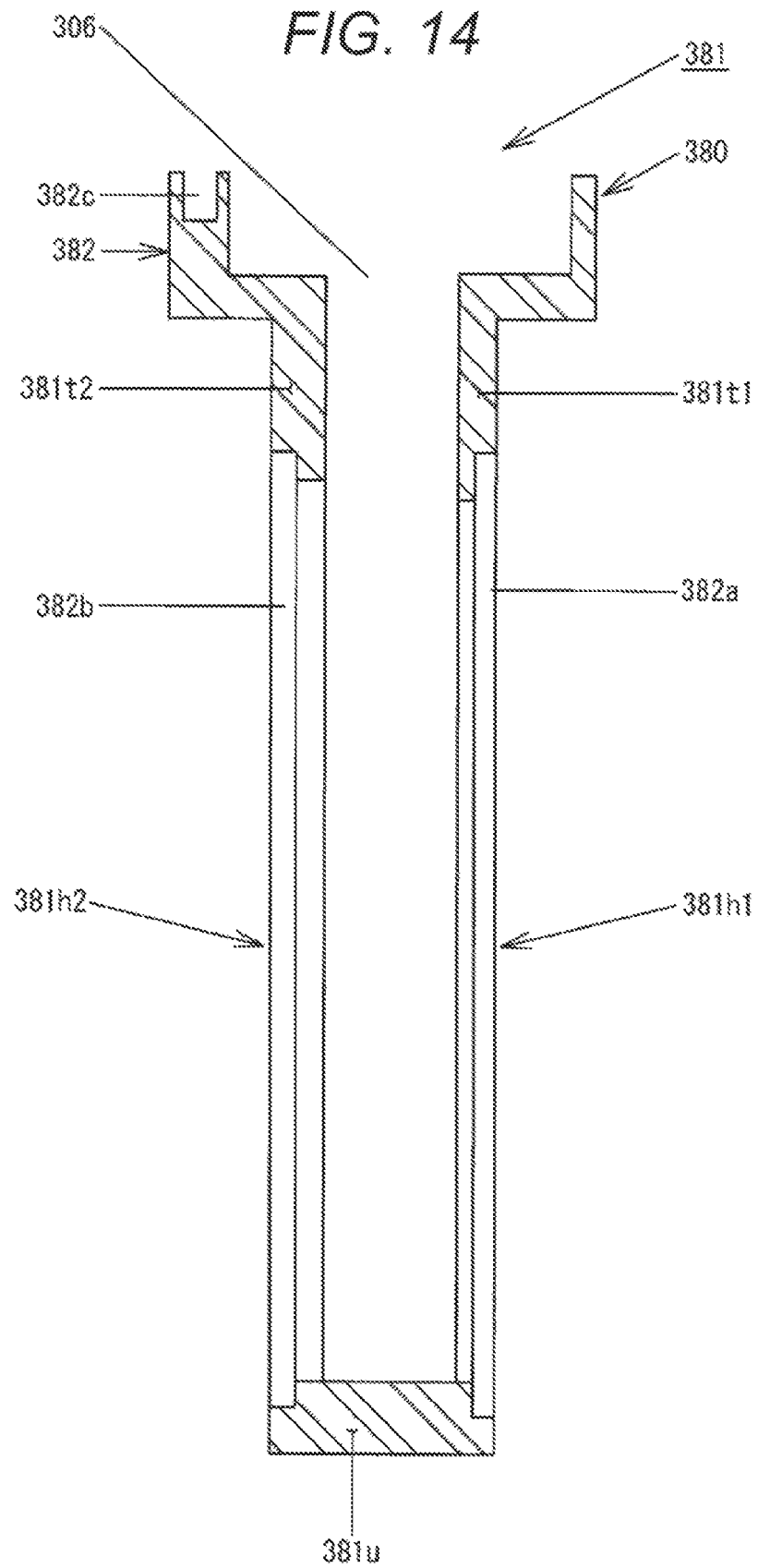
FIG. 14 is a cross sectional schematic view illustrating a frame body.

FIG. 14 is a cross sectional schematic view illustrating the frame body 380. As illustrated in FIG. 14, the frame body 380 includes a frame portion 381 and a flange portion 382, and is integrally formed by pressing and the like. As illustrated in FIGS. 11 and 12, the frame portion 381 is joined with the first and second heat sinks 371, 372, thus forming a cylindrical unit 390 in a cylindrical shape having a bottom in which the module primary encapsulant body 302 is accommodated.

As illustrated in FIGS. 13 and 14, the frame portion 381 includes a pair of side plates 381s1, 381s2 (see FIG. 13), a bottom plate 381u connecting the lower portions of the pair of side plates 381s1, 381s2, and a pair of upper portion side plate 381t1, 381t2 connecting the upper portions of the pair of side plates 381s1, 381s2 (see FIG. 14), and has an overall shape in which rectangular opening portions 381h1, 381h2 are formed on the pair of wide surfaces of the cylindrical body having the bottom.

At the peripheral edge of the rectangular opening portion 381h1 of the frame portion 381, a step portion 382a engaging with the first heat sink 371 is provided. Likewise, at the peripheral edge of the rectangular opening portion 381h2 of the frame portion 381, a step portion 382b engaging with the second heat sink 372 is provided (see FIG. 14).

As illustrated in FIG. 12, when the protruding matching unit 371b of the first heat sink 371 is engaged with the step portion 382b, the end surface 371b1 of the protruding matching unit 371b comes into contact with the side wall of the step portion 382a. When the rotation tool is rotated and moved along the contact surface (protruding matching unit), the frictional heat is generated between the metal member and the rotation tool, and accordingly, the protruding matching unit of the frame portion 381 and the first heat sink 371 is heated and soften, whereby plastic flow is caused by the ration of the rotation tool, so that the protruding matching units are welded by solid-state welding, and the first heat sink 371 is fixed to the frame portion 381. Likewise, when the protruding matching unit 372b of the second heat sink 372 is engaged with the step portion 382b, the end surface 372b2 of the protruding matching unit 372b comes into contact with the side wall of the step portion 382b, and when the rotation tool is rotated and moved along the contact surface (protruding matching unit), the protruding matching units of the frame portion 381 and the second heat sink 372 are welded by solid-state welding, and the second heat sink 372 is fixed to the frame portion 381. As described above, the first heat sink 371 and the second heat sink 372 are joined to close the rectangular opening portions 381h1, 381h2 of the frame portion 381 by Friction Stir Welding.

As illustrated in FIG. 12, the flange portion 382 is provided in such a manner that it protrudes from the insertion opening 306 to the outside so as to enclose the insertion opening 306 of the cylindrical unit 390. As illustrated in FIG. 11, the flange portion 382 is provided with a screw hole 382e to which the screw 309 for attaching the supporting mold body 600 is attached, a positioning hole 382c engaged with the positioning pin 601, and a hole 382d through which a screw (not shown) for attaching the flange portion 382 to the channel forming body 12 is inserted.

Figure 15:
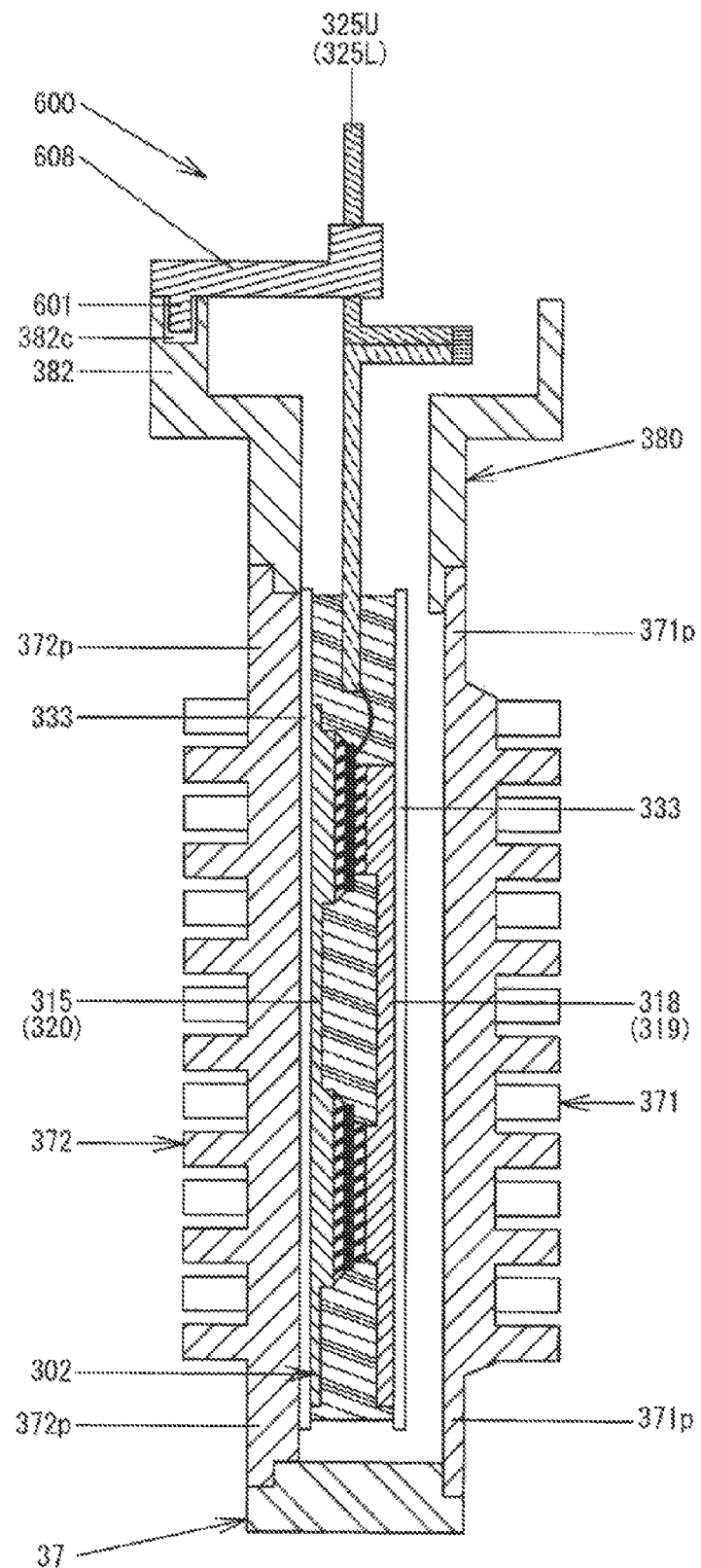
FIG. 15 is a cross sectional schematic view illustrating how the module primary encapsulant body is inserted into the module case.
Figure 16:
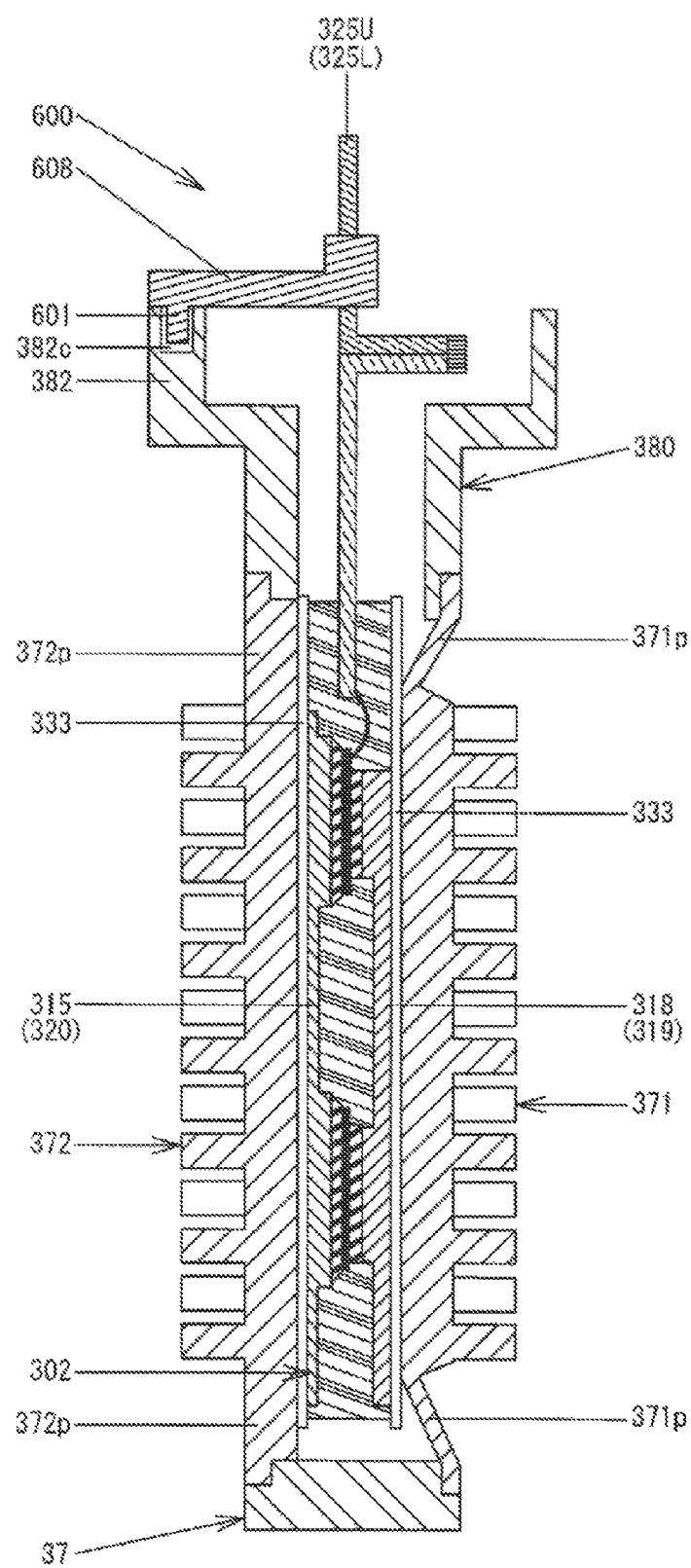
FIG. 16 is a cross sectional schematic view illustrating the state in which the module is pressurized and the first and second heat sinks are brought into pressurized contact with the module primary encapsulant body.

The method for making the power module by accommodating and integration the module primary encapsulant body 302 in the module case 37 will be explained in detail with reference to FIGS. 15 and 16. FIG. 15 is a cross sectional schematic view illustrating how the module primary encapsulant body 302 is inserted into the module case 37. FIG. 16 is a cross sectional schematic view illustrating the first and second heat sinks 371, 372 brought into pressurized into contact with the module primary encapsulant body 302 by pressurizing the wide surface of the module case 37 from the outside.

As illustrated in FIG. 15, the module primary encapsulant body 302 is inserted into the module case 37 while sandwiched by the insulating sheet 333. During insertion, the positioning pin 601 of the supporting mold body 600 is inserted into the positioning hole 382c of the flange portion 382, and positioning is achieved by bringing the wide surface of the module primary encapsulant body 302 into the second heat sink 372 constituting the inner surface of the module case 37. Thereafter, with the screw 309 (see FIGS. 6 and 11), the supporting mold body 600 is mechanically fixed to the module case 37. Accordingly, the external leads of the signal terminals 325U, 325L, 327, and the like can be easily attached to predetermined position of the driver circuit board 22 and the like. At this occasion, the first heat sink 371 is arranged to face the conductive plates 318, 319, and the second heat sink 372 is arranged to face the conductive plates 315, 320. The second heat sink 372 is in contact with the module primary encapsulant body 302 with the insulating sheet 333 interposed therebetween, but there is space between the first heat sink 371 and the module primary encapsulant body 302.

While the contact plate (not shown) is brought into contact with the second heat sink 372 from the outer side, the first heat sink 371 is pressed from the external side toward the inner side of the module case 37. As described above, the first heat sink 371 has the thin fin peripheral edge unit 371p thinner than the base of the heat radiation fin unit 371f, and therefore when the first heat sink 371 is pressed, the thin fin peripheral edge unit 371p is deformed preferentially as illustrated in FIG. 16, and the first heat sink 371 constituting the inner surface of the module case 37 is crimped to the other wide surface of the module primary encapsulant body 302, and at the same time the second heat sink 372 is also crimped to the wide surface of the module primary encapsulant body 302.

When The first heat sink 371 is pressed against the side of the second heat sink 372, the pressure is also applied to the second heat sink 372 supported by the contact plate toward the inner side in the module case 37 from the external side. However, the material thickness t2 of the fin peripheral edge unit 372p of the second heat sink 372 is thinner than the material thickness t1 of the material thickness t1 of the fin peripheral edge unit 371p of the first heat sink 371 (see FIG. 12), and the second heat sink 372 is not deformed.

The frame body 380 has a higher degree of rigidity than the first and second heat sinks 371, 372, and therefore, the frame body 380 is not deformed. As described above, when the module case 37 is pressurized, only the peripheral edge unit 371p of the first heat sink 371 is deformed with a high degree of priority, and therefore, at a position where the module primary encapsulant body 302 and the supporting mold body 600 is positioned, the module case 37 can be crimped to the module primary encapsulant body 302 with the insulating sheet 333 interposed therebetween.

When the second sealing resin 351 is filled in the module case 37, the space remaining in the module case 37 is filled, and the module case 37 is sealed as illustrated in FIG. 7.

As illustrated in FIG. 4, the power module 300a formed as described above is inserted from the opening unit 400a of the channel forming body 12 so that it crosses the flow direction of the coolant, and the flange portion 382 (see FIG. 6) is attached to the channel forming body 12, so that the opening unit 400a at the upper surface side of the channel forming body 12 is sealed. Accordingly, even if the module case 37 is inserted into the cooling channel 19 in which the coolant flows, the seal for the coolant can be obtained with the flange portion 382, and therefore, this prevents the coolant from entering into the inside of the module case 37.

The first heat sink 371 and the second heat sink 372 are arranged such that the wide surface is arranged along the flow direction of the coolant, and the pin fin protrudes in the direction perpendicular to the flow direction of the coolant. The first heat radiation member 371 and the second heat radiation member 372 exchange heat with the coolant flowing in the cooling channel 19. The heat from the power semiconductor device is transmitted via the conductive plate and the like to the external surface of the module case 37 including the pin fins of the first and second heat sinks 371, 372, and the heat is radiated to the coolant.

As illustrated in FIGS. 2 and 6, the signal terminals 325U (154), 325L (164), 327 (155, 165) protruding from the power module 300a are connected with the driver circuit 174, and the direct current positive/negative terminals 315B (157), 319B (158) are connected to the electric power providing bus bar, and the alternate current terminal 320B (159) is connected to the alternate current bus bar 802.

According to the present embodiment explained above, the following actions and effects can be achieved.

(1) The frame body 380 and the first heat sink 371 and the second heat sink 372 are individually formed, and the first and second heat sinks 371, 372 are joined with the frame body 380, so that the module case 37 is formed. Accordingly, the material can be selected in accordance with the function of the constituent component, and the material is selected for the frame body 380 with the rigidity being regarded as important, and the material can be selected for the first heat sink 371 and the second heat sink 372 with the heat radiation performance being regarded as important.

As a result, the power modules 300a to 300c and the power conversion apparatus 200 using the same can be selected while achieving not only high degree of rigidity but also high heat radiation performance.

(2) Further, the surfaces of the first heat sink 371 and the second heat sink 372 constituting the inner surface of the module case 37 can be made into a desired degree of surface precision in advance. In the conventional technique in which the module case is integrally formed, the adhesive surface of the insulating sheet 333 may be undulated, and there is a problem in that the heat radiation surface of the conductive plate is only in contact with only a part via the insulating sheet 333. However, according to the present embodiment, as described above, the surface precision of the inner surface of the module case 37 can be improved, and the contact surface with the conductive plate in contact with the insulating sheet 333 can be increased. As a result, the heat generated from the power semiconductor device can be efficiently transmitted to the first heat sink 371 and the second heat sink 372.

(3) The material thickness t1 of the fin peripheral edge unit 371p is configured to be thinner than the material thickness t2 of the fin peripheral edge unit 372p (t1<t2), so that the bending rigidity of the fin peripheral edge unit 371p of the first heat sink 371 is lower than the bending rigidity of the fin peripheral edge unit 372p of the second heat sink 372. Accordingly, in a step of pressurizing the module case 37 and crimping the module case 37 to the module primary encapsulant body 302, the fin peripheral edge unit 371p of the first heat sink 371 is preferentially deformed.

Therefore, when the module primary encapsulant body 302 is positioned so that the wide surface of the module primary encapsulant body 302 is in contact with the second heat sink 372 constituting the inner surface of the module case 37, the second heat sink 372 is not deformed during pressurizing process, and therefore, the positions of the module primary encapsulant body 302 and the supporting mold body 600 are deviated, and the module case 37 can be crimped to the module primary encapsulant body 302. As a result, the signal terminals 325U, 325L, 327 and the like are arranged at predetermined positions of the driver circuit board 22 and the like, and can be easily connected to predetermined portions.

In contrast, the material thicknesses of both of the fin peripheral edge units of the first and second heat sinks are formed to be thin, and the module primary encapsulant body 302 is arranged at the center of the module case, and the following problem occurs when the power module is made by applying external pressure to the first and second heat sinks. More specifically, because there is difference in the amount of deformation of both of the first and second heat sinks, the position of the module primary encapsulant body 302 is deviated, and it may be difficult to appropriately join the driver circuit board 22 and the like and the signal terminals 325U, 325L, 327 and the like.

(4) The frame body 380 and the first heat sink 371, and the frame body 380 and the second heat sink 372 are joined by solid-state welding. Accordingly, this ensures the sealing property of the joint surface between the frame body 380 and the first heat sink 371 and the joint surface between the frame body 380 and the second heat sink 372, and each of the first and second heat sinks 371, 372 can be firmly fixed to the frame body 380.

(5) In the present embodiment, the frame body 380 and the first and second heat sinks 371, 372 are individually manufactured, and the three components are joined, and therefore, the power module having a high degree of rigidity and having a less number of components can be provided, as opposed to the configuration for holding the pair of heat sinks by adhering the bottom case, the top case, and the pair of side cases with adhesive which is a conventional technique.

(6) In the present embodiment, the frame body 380 integrally formed has a high degree of rigidity, and therefore, this can ensure sufficient level of durability against deformation, and, deformation by creep, fatigue fracture, and the like when the power module is mechanically fixed to the case of the power conversion apparatus.

The following modifications are also within the scope of the present invention, and one or more of modification can also be combined with the above embodiment.

(1) The present invention is not limited to the case where the material thickness t1 of the fin peripheral edge unit 371p of the first heat sink 371 is configured to be thinner than the material thickness t2 of the fin peripheral edge unit 372p of the second heat sink 372. The fin peripheral edge units 371p, 372p may be of the same thickness, and the first and second heat sinks 371, 372 may be pressurized from the external side toward the inside of the module case 37, so that both of the fin peripheral edge units 371p, 372p may be deformed, and the module case 37 may be crimped to the module primary encapsulant body 302. As described above, when one of the fin peripheral edge units 371p, 372p is preferentially deformed, the deviation of the position of the module primary encapsulant body 302 is prevented, and therefore, it is preferable to preferentially deform one of the fin peripheral edge units 371p, 372p.

(2) In the above embodiment, the material thicknesses of the fin peripheral edge unit 371p of the first heat sink 371 and the fin peripheral edge unit 372p of the second heat sink 372 is changed, so that the bending rigidity is changed, and when the first and second heat sinks 371, 372 are pressurized, one of them is preferentially deformed. However, the present invention is not limited thereto. The bending rigidities of the cross sectional shapes of the fin peripheral edge unit 372p of the second heat sink 372 and the fin peripheral edge unit 371p of the first heat sink 371 may be changed, and one of the fin peripheral edge unit 372p of the second heat sink 372 and the fin peripheral edge unit 371p of the first heat sink 371 may be preferentially deformed. The thicknesses of the fin peripheral edge unit 371p of the first heat sink 371 and the fin peripheral edge unit 372p of the second heat sink 372 may be configured to be the same, and a beam which is a separate member is attached to one of them to increase the bending rigidity. Both of the material thicknesses of the fin peripheral edge unit 371p of the first heat sink 371 and the fin peripheral edge unit 372p of the second heat sink 372 may be increased, and multiple cut outs may be made in one of them to reduce the bending rigidity. As described above, according to various kinds of modes, the bending rigidities of both of the fin peripheral edge units 371p, 372p are changed, so that one of the fin peripheral edge units 371p, 372p can be preferentially deformed.

(3) The heat radiation fin is not limited to the case where the pin shaped members are employed. Various kinds of shapes such as flat plate-like fins may be employed. The shape and the number of fins are determined on the basis of the cooling performance and the pressure drop required.

(4) The present invention is not limited to the case where the frame body 380 and the first heat sink 371, and the frame body 380 and the second heat sink 372 are joined by solid-state welding. Alternatively, the frame body 380 and the first heat sink 371, and the frame body 380 and the second heat sink 372 may be joined by fused junction.

(5) In order to improve the adhesive property of the insulating sheet 333, an adhesive layer may be provided on the surface of the insulating sheet 333 in advance.

(6) In the above embodiment, the insulating sheet 333 is a resin sheet made by dispersing ceramics particles in the epoxy resin. However, the present invention is not limited thereto. The insulating sheet 333 may employ ceramics sheet such as aluminum oxide, silicon nitride, aluminum nitride having better heat conductivity than resin, and the heat radiation grease may be applied to both surfaces of the ceramics sheet.

(7) In the above embodiment, the insulating sheet 333 is used, but the present invention is not limited thereto. Instead of the insulating sheet 333, grease, compound, and the like having insulating property may be used.

(8) In the above embodiment, the material thickness tb1 of the protruding matching unit 371b of the first heat sink 371 is of the same thickness as the material thickness t1 of the fin peripheral edge unit 371p. However, the present invention is not limited thereto. The material thickness tb1 of the protruding matching unit 371b may be configured to be thicker than the material thickness t1 of the fin peripheral edge unit 371p.

(9) The above embodiment employs the configuration in which the first heat sink 371, the second heat sink 372, and the frame body 380 are individually formed and assembled, and employs the both-sides cooling method for providing the power module 300a in the cooling channel 19 and cooling both of the first heat sink 371 and the second heat sink 372. However, the present invention is not limited thereto. Alternatively, it may be possible to employ one side cooling method for using a wide surface of the module case as the heat radiation surface arranged in the cooling channel, and the module case may be constituted by one heat sink and a frame body.

(10) The power conversion apparatus can be used as a vehicle power supply apparatus for other electric vehicles such as railroad vehicles such as a hybrid train, cargo vehicles such as a truck, and an industrial vehicle such as a battery forklift truck.

(11) The power conversion apparatus may be applied to a power conversion apparatus constituting a power supply apparatus other than an electric vehicle, such as uninterruptible power systems used for computer systems and server systems, and power supply apparatuses used for private power generation facilities.

As long as the features of the present invention are not lost, the present invention is not limited to the above embodiment. Other modes that can be conceived of within the scope of the technical concept of the present invention are also included within the scope of the present invention.

The contents disclosed in the following priority basis application are incorporated herein by reference.

Japanese Patent Application No. 2011-128304 (filed on Jun. 8, 2011).

The invention claimed is:

1. A power module comprising:
   a plurality of semiconductor devices constituting upper/lower arms of an inverter circuit;
   a plurality of conductive plates arranged to face electrode surfaces of the semiconductor devices; and
   a module case configured to accommodate the semiconductor devices and the conductive plates,
   wherein the module case includes,
   a heat radiation member made of plate-like metal and facing a surface of the conductive plate, and
   a metallic frame body having an opening portion that is closed by the heat radiation member,
   wherein a heat radiation fin unit having a plurality of heat radiation fins vertically arranged thereon is provided at a center of the heat radiation member, and a joint portion with the frame body is provided at an external peripheral edge of the heat radiation member, and
   the heat radiation member has a thermal conductivity higher than that of the frame body, and the frame body is of a higher rigidity than that of the heat radiation member.

2. The power module according to claim 1, wherein the heat radiation member is a first heat sink and a second heat sink arranged to face each other.

3. The power module according to claim 2, wherein the first heat sink and the second heat sink have a fin peripheral edge unit provided to enclose the heat radiation fin unit between the joint portion and the heat radiation fin unit of them each, and
   when pressure is applied to the first heat sink and the second heat sink from an external side toward inside of the module case, bending rigidity of the peripheral edge unit of the first heat sink is configured to be less than bending rigidity of the peripheral edge unit of the second heat sink, so that the peripheral edge unit of the first heat sink is preferentially deformed.

4. The power module according to claim 3, wherein a thickness of the fin peripheral edge unit of the first heat sink is thinner than a thickness of the fin peripheral edge unit of the second heat sink.

5. The power module according to claim 2, wherein the plurality of conductive plates include a first conductive plate connected via a metal bonding material with an electrode surface of the semiconductor device, a second conductive plate connected via the metal bonding material with the other electrode surface of the semiconductor device, a module primary encapsulant body made by sealing the semiconductor device, the first conductive plate, and the second conductive plate with an encapsulant and the module case are crimped with an insulating member, and a portion of the first and second conductive plates is exposed from the encapsulant so as to be in contact with the insulating member.

6. The power module according to claim 2, wherein the frame body and the first heat sink, and the frame body and the second heat sink are joined by fused junction or solid-state welding.

7. A power conversion apparatus configured to convert electric power from a direct current to an alternate current or from an alternate current to a direct current, using switching operation of a semiconductor device, the power conversion apparatus comprising:

the power module according to claim 2; and a channel forming body configured to from a cooling channel in which coolant flows, wherein the power module has first and second heat sinks arranged in the cooling channel and performs heat exchange with a coolant flowing in the cooling channel, so that heat from the semiconductor device is radiated to the coolant.

8. The power conversion apparatus according to claim 7, wherein the channel forming body is formed with an opening portion in communication with the cooling channel, the power module includes a cylindrical unit in a cylindrical shape having a bottom; and a flange portion formed in an opening of the cylindrical unit and fixed to the channel forming body to close the opening portion of the channel forming body, wherein the cylindrical unit is formed by joining the first heat sink and the second heat sink to the frame body, and a heat radiation fin provided on each of the first heat sink and the second heat sink is vertically arranged to protrude in the cooling channel.

\* \* \* \* \*